(12) United States Patent
Nakagawa et al.

(10) Patent No.: US 10,396,044 B2
(45) Date of Patent: Aug. 27, 2019

(54) SEMICONDUCTOR DEVICE

(71) Applicant: Renesas Electronics Corporation, Koutou-ku, Tokyo (JP)

(72) Inventors: Kazuyuki Nakagawa, Tokyo (JP); Keita Tsuchiya, Tokyo (JP); Yoshiaki Sato, Tokyo (JP); Shinji Baba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/759,211

(22) PCT Filed: Oct. 15, 2015

(86) PCT No.: PCT/JP2015/079179
§ 371 (c)(1),
(2) Date: Mar. 10, 2018

(87) PCT Pub. No.: WO2017/064791
PCT Pub. Date: Apr. 20, 2017

(65) Prior Publication Data
US 2018/0254252 A1 Sep. 6, 2018

(51) Int. Cl.
*H01L 23/495* (2006.01)
*H01L 23/64* (2006.01)
(Continued)

(52) U.S. Cl.
CPC ............ *H01L 23/642* (2013.01); *H01G 4/38* (2013.01); *H01G 4/40* (2013.01); *H01L 21/4853* (2013.01);
(Continued)

(58) Field of Classification Search
None
See application file for complete search history.

(56) References Cited

U.S. PATENT DOCUMENTS 6,876,554 B1 * 4/2005 Inagaki .................. H01G 4/224
361/763
7,791,210 B2 * 9/2010 Miller .............. H01L 23/49838
257/690
(Continued)

FOREIGN PATENT DOCUMENTS

JP 2002-009225 A 1/2002
JP 2002-100874 A 4/2002
(Continued)

OTHER PUBLICATIONS

International Search Report from International Patent Application No. PCT/JP2015/079179, dated Jan. 12, 2016.
(Continued)

Primary Examiner — Hung K Vu
(74) Attorney, Agent, or Firm — Shapiro, Gabor and Rosenberger, PLLC

(57) ABSTRACT

A semiconductor device includes a wiring substrate including a first surface and a second surface opposite to the first surface, a semiconductor chip including a plurality of chip electrodes and mounted over the wiring substrate, a first capacitor arranged at a position overlapping with the semiconductor chip in plan view and incorporated in the wiring substrate, and a second capacitor arranged between the first capacitor and a peripheral portion of the wiring substrate in plan view. Also, the second capacitor is inserted in series connection into a signal transmission path through which an electric signal is input to or output from the semiconductor chip.

16 Claims, 23 Drawing Sheets

(51) Int. Cl.
| | |
|---|---|
| H01L 23/12 | (2006.01) |
| H01L 25/00 | (2006.01) |
| H05K 3/46 | (2006.01) |
| H01L 21/48 | (2006.01) |
| H01L 21/66 | (2006.01) |
| H01L 23/16 | (2006.01) |
| H01L 23/367 | (2006.01) |
| H01L 23/498 | (2006.01) |
| H01L 23/00 | (2006.01) |
| H01G 4/38 | (2006.01) |
| H01G 4/40 | (2006.01) |
| H05K 1/02 | (2006.01) |
| H05K 1/18 | (2006.01) |
| H01L 23/36 | (2006.01) |
| H01L 23/50 | (2006.01) |
| H01G 2/06 | (2006.01) |
| G01R 31/28 | (2006.01) |

(52) U.S. Cl.
CPC ...... *H01L 21/4857* (2013.01); *H01L 21/4871* (2013.01); *H01L 22/12* (2013.01); *H01L 23/12* (2013.01); *H01L 23/16* (2013.01); *H01L 23/36* (2013.01); *H01L 23/3675* (2013.01); *H01L 23/49822* (2013.01); *H01L 23/49838* (2013.01); *H01L 23/50* (2013.01); *H01L 24/16* (2013.01); *H01L 25/00* (2013.01); *H05K 1/0231* (2013.01); *H05K 1/185* (2013.01); *H05K 3/46* (2013.01); *G01R 31/2836* (2013.01); *H01G 2/06* (2013.01); *H01L 2224/16227* (2013.01); *H01L 2224/73204* (2013.01); *H01L 2224/73253* (2013.01); *H01L 2924/15311* (2013.01); *H01L 2924/16195* (2013.01); *H01L 2924/19041* (2013.01); *H01L 2924/19103* (2013.01); *H01L 2924/19105* (2013.01); *H01L 2924/3511* (2013.01)

(56) References Cited

U.S. PATENT DOCUMENTS

| | | | |
|---|---|---|---|
| 2002/0049042 A1* | 4/2002 | Oida | ............... H01L 23/552 455/550.1 |
| 2008/0237890 A1 | 10/2008 | Tago | |
| 2009/0032922 A1* | 2/2009 | Koga | ............... H01L 23/50 257/676 |
| 2010/0124035 A1 | 5/2010 | Bandholz et al. | |
| 2011/0011634 A1 | 1/2011 | Moldauer et al. | |
| 2012/0080222 A1 | 4/2012 | Kim et al. | |
| 2014/0146499 A1 | 5/2014 | Jang et al. | |
| 2014/0285213 A1 | 9/2014 | Sakurai et al. | |

FOREIGN PATENT DOCUMENTS

| | | |
|---|---|---|
| JP | 2003-142628 A | 5/2003 |
| JP | 2008-227177 A | 9/2008 |
| JP | 2009-038111 A | 2/2009 |
| JP | 2010-021275 A | 1/2010 |
| JP | 2012-089590 A | 5/2012 |
| JP | 2014-187127 A | 10/2014 |
| WO | WO 2005/114729 A1 | 12/2005 |
| WO | WO 2006/001087 A1 | 1/2006 |

OTHER PUBLICATIONS

Office Action, dated Mar. 12, 2019, in Japanese Application No. 2017-545052.
Office Action, dated Jun. 7, 2019, in European Application No. 15906255.3.

* cited by examiner

SEMICONDUCTOR DEVICE

TECHNICAL FIELD

The present invention relates to a semiconductor device including a wiring substrate over which a semiconductor chip is mounted and in which a capacitor is mounted.

BACKGROUND ART

In Japanese Patent Application Laid-Open Publication No. 2010-21275 (Patent Document 1), Japanese Patent Application Laid-Open Publication No. 2009-38111 (Patent Document 2), Japanese Patent Application Laid-Open Publication No. 2012-89590 (Patent Document 3), and International Publication No. WO 2006/001087 (Patent Document 4), a semiconductor device including a wiring substrate on which chip components such as a semiconductor chip and a capacitor are mounted is described.

RELATED ART DOCUMENTS

Patent Documents

Patent Document 1: Japanese Patent Application Laid-Open Publication No. 2010-21275
Patent Document 2: Japanese Patent Application Laid-Open Publication No. 2009-38111
Patent Document 3: Japanese Patent Application Laid-Open Publication No. 2012-89590
Patent Document 4: International Publication No. WO 2006/001087

SUMMARY OF THE INVENTION

Problems to be Solved by the Invention

There is a technique of mounting a plurality of semiconductor devices on a wiring board such as a motherboard and connecting a capacitor in series in a signal path electrically connecting the plurality of semiconductor devices with each other. This capacitor is intended to cut off a DC component contained in an AC signal and thus called a direct current (DC) cut-off capacitor or an alternate current (AC) coupling capacitor (hereinafter referred to as the DC cut-off capacitor).

In an effort to miniaturize an electronic device performing input and output of a signal between a plurality of semiconductor devices as described above, the inventors of the present application have examined a technique whereby a DC cut-off capacitor that has been mounted on a wiring substrate is mounted inside the semiconductor device.

As a result of the above examination, it became clear that, by simply incorporating the DC cut-off capacitor inside the semiconductor device, a problem arises from the viewpoint of electrical characteristics and reliability of the semiconductor device, depending on layout of the capacitor.

Other objects and novel features of the present invention will be apparent from the description of the present specification and the accompanying drawings.

Means for Solving the Problems

A semiconductor device according to one embodiment includes a wiring substrate including a first surface and a second surface opposite to the first surface, a semiconductor chip including a plurality of chip electrodes and mounted over the wiring substrate, a first capacitor arranged at a position overlapping with the semiconductor chip in plan view and incorporated in the wiring substrate, and a second capacitor arranged between the first capacitor and a peripheral portion of the wiring substrate in plan view. Also, the second capacitor is inserted in series connection into a signal transmission path through which an electric signal is input to or output from the semiconductor chip.

Effects of the Invention

According to the above-described embodiment, it is possible to enhance electrical characteristics and reliability of a semiconductor device.

BRIEF DESCRIPTIONS OF THE DRAWINGS

Figure 5:
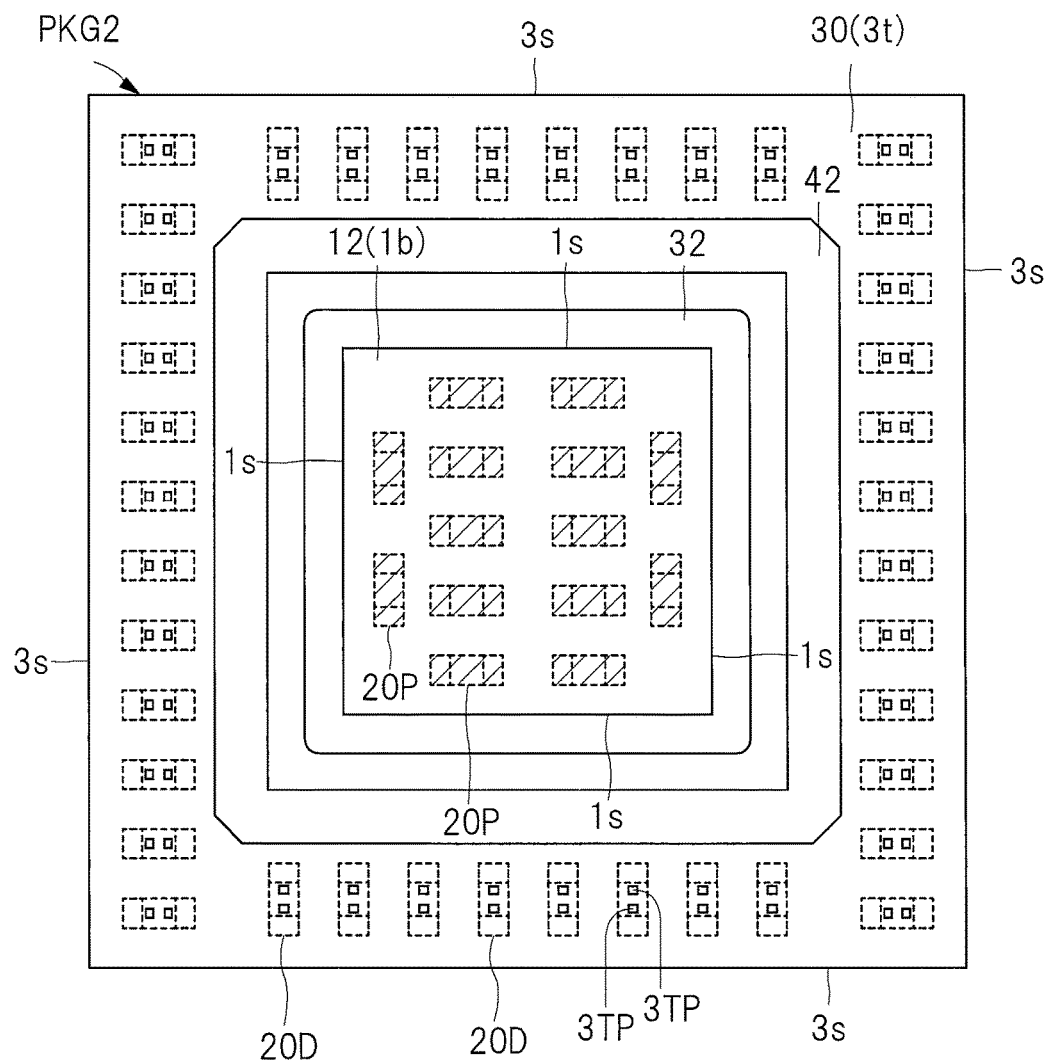
FIG. 5 is a plan view illustrating an internal structure of the semiconductor device on a wiring substrate in a state where a heat dissipation plate illustrated in FIG. 3 is removed.
Figure 32:
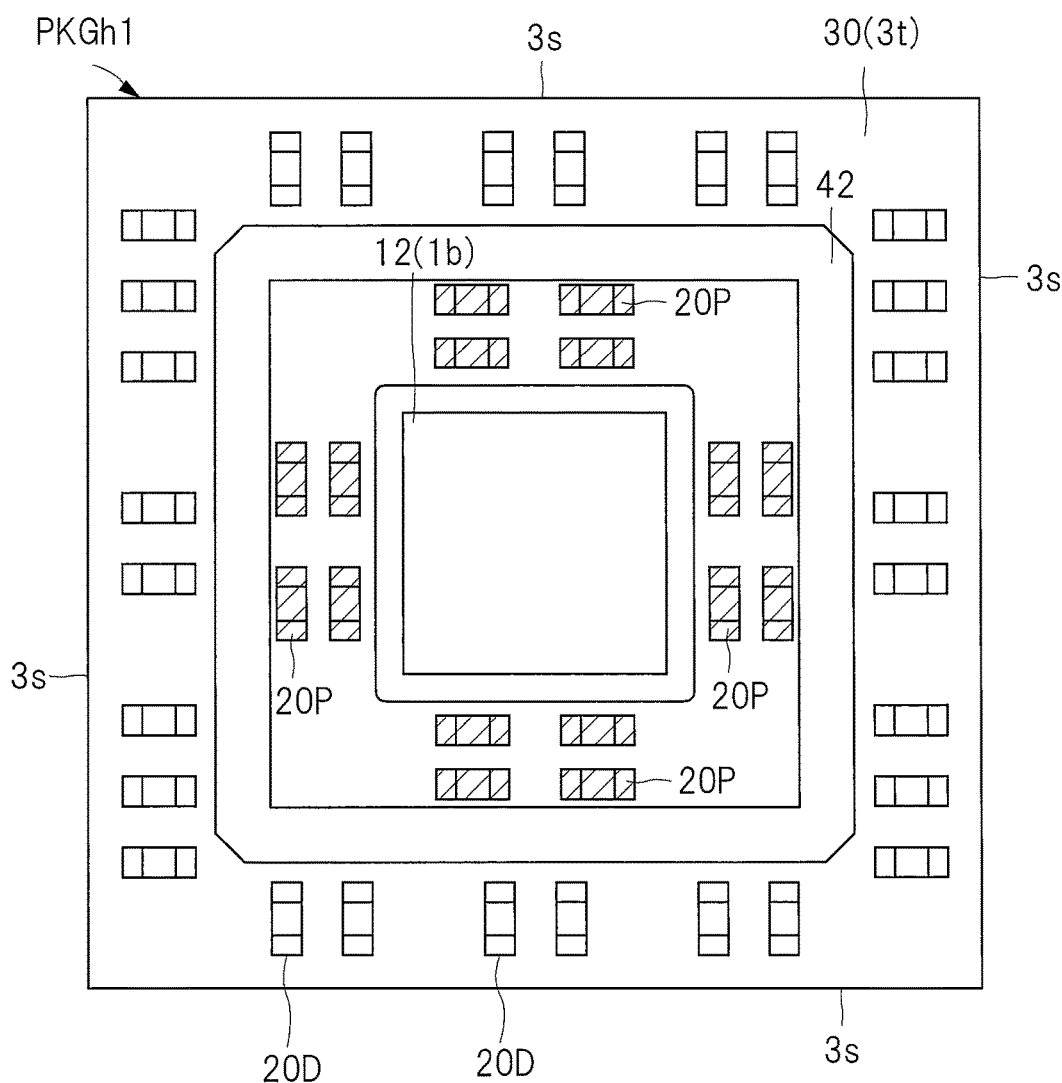
Figure 33:
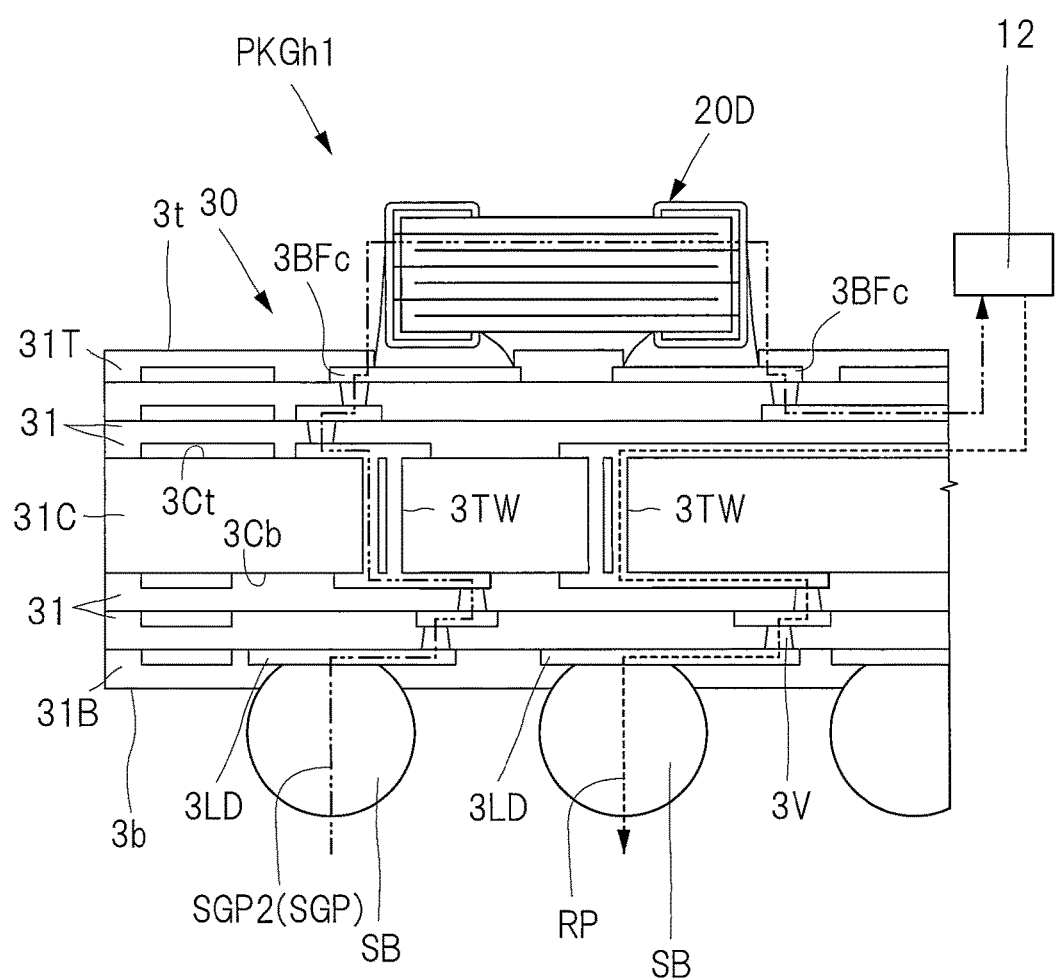

FIG. 32 is a plan view illustrating a positional relation between a plurality of capacitors and a semiconductor chip, seen through a heat dissipation plate from a side of an upper surface of a wiring substrate included in a semiconductor device according to a study example with respect to FIG. 5; and FIG. 33 is an enlarged cross-sectional view schematically illustrating an exemplary signal transmission path connected to the DC cut-off capacitor illustrated in FIG. 32.

DETAILED DESCRIPTION OF PREFERRED EMBODIMENTS

Description of Description Form, Basic Terms and Method in Present Application

In this application, the embodiment will be described in a plurality of sections or the like when required as a matter of convenience. However, these sections are not independent or distinct from each other unless particularly explicitly described otherwise, and they are individual parts of a single example, one of them is a partial detail of the other, or one of them is a modification example or the like of part or the whole of the other, irrespective of the order of descriptions. Also, the description of the same portions is not repeated in principle. Further, each component in the embodiment is not indispensable unless particularly explicitly described otherwise, unless the component is logically limited to a specific number, and unless it is obvious from the context that the component is indispensable.

Similarly, in the description of an embodiment and others, even when "X made of A" or the like is referred to with respect to a material, a composition, and the like, X containing elements other than A is not excluded unless particularly explicitly described otherwise and unless it is obvious from the context that X does not contain elements other than A. For example, when referring to an ingredient, it means "X containing A as a main ingredient" or the like. For example, even when "silicon member" or the like is mentioned, the meaning is not limited to pure silicon, and it is needless to say that a member containing a SiGe (silicon-germanium) alloy, another multi-element alloy containing silicon as a main ingredient, another additive, or the like is also included. In addition, even when a gold plating, a Cu layer, a nickel plating, and others are mentioned, not only a pure one but also a member containing each of gold, Cu, and nickel as a main ingredient is included unless particularly explicitly described otherwise.

Further, even when a specific value or amount is mentioned, a value larger than a specific value or smaller than the specific value is also applicable unless particularly explicitly described otherwise, unless it is logically limited to the specific value, and unless it is obvious from the context that a value is not larger than the specific value or smaller than the specific value.

Also, the same or similar portions are denoted by the same or similar reference signs or characters throughout the drawings for describing the embodiment, and the repetitive description thereof is omitted.

In addition, in the accompanying drawings, hatching may be omitted even in a cross section in a case where the drawings become rather complicated or distinction from a clearance is apparent. In association with this, when it is obvious from the description or the like, a contour line in a background may be omitted even in a case of a planarly closed hole. In addition, in order to specify the fact that a portion is not a clearance or specify a boundary of regions, hatching or dot pattern may be given even in the case other than the cross section.

EMBODIMENTS

<Electronic Device>

Figure 1:
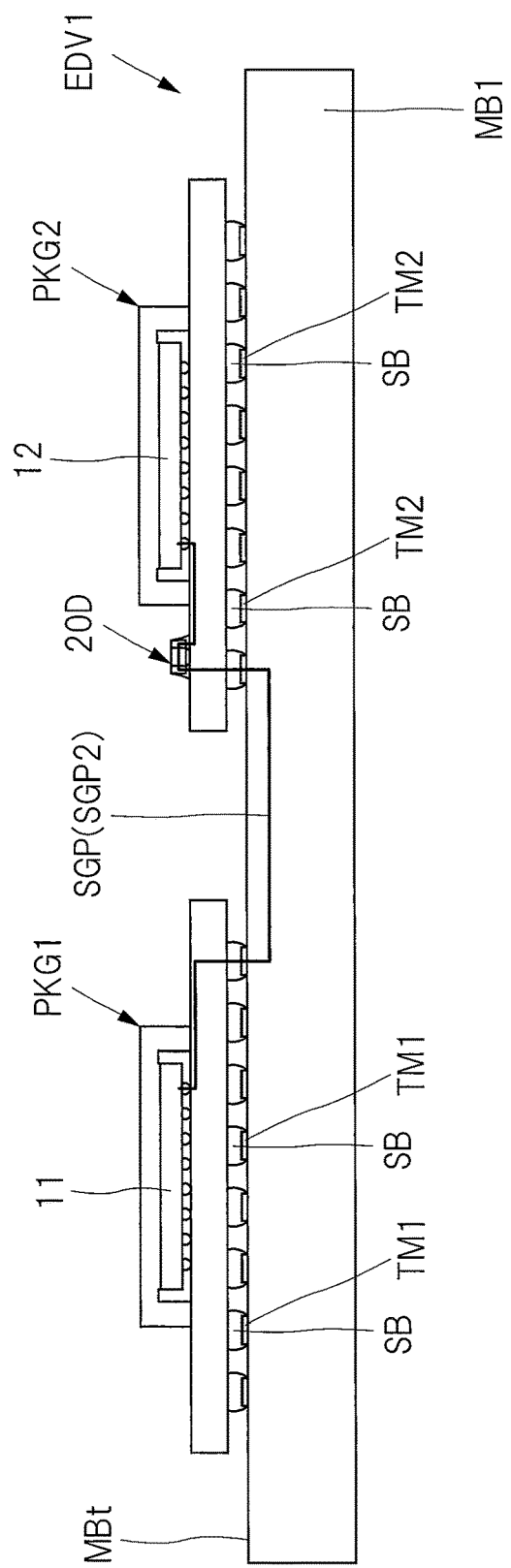
FIG. 1 is an explanatory diagram illustrating an exemplary configuration of an electronic device including a semiconductor device according to one embodiment.
Figure 2:
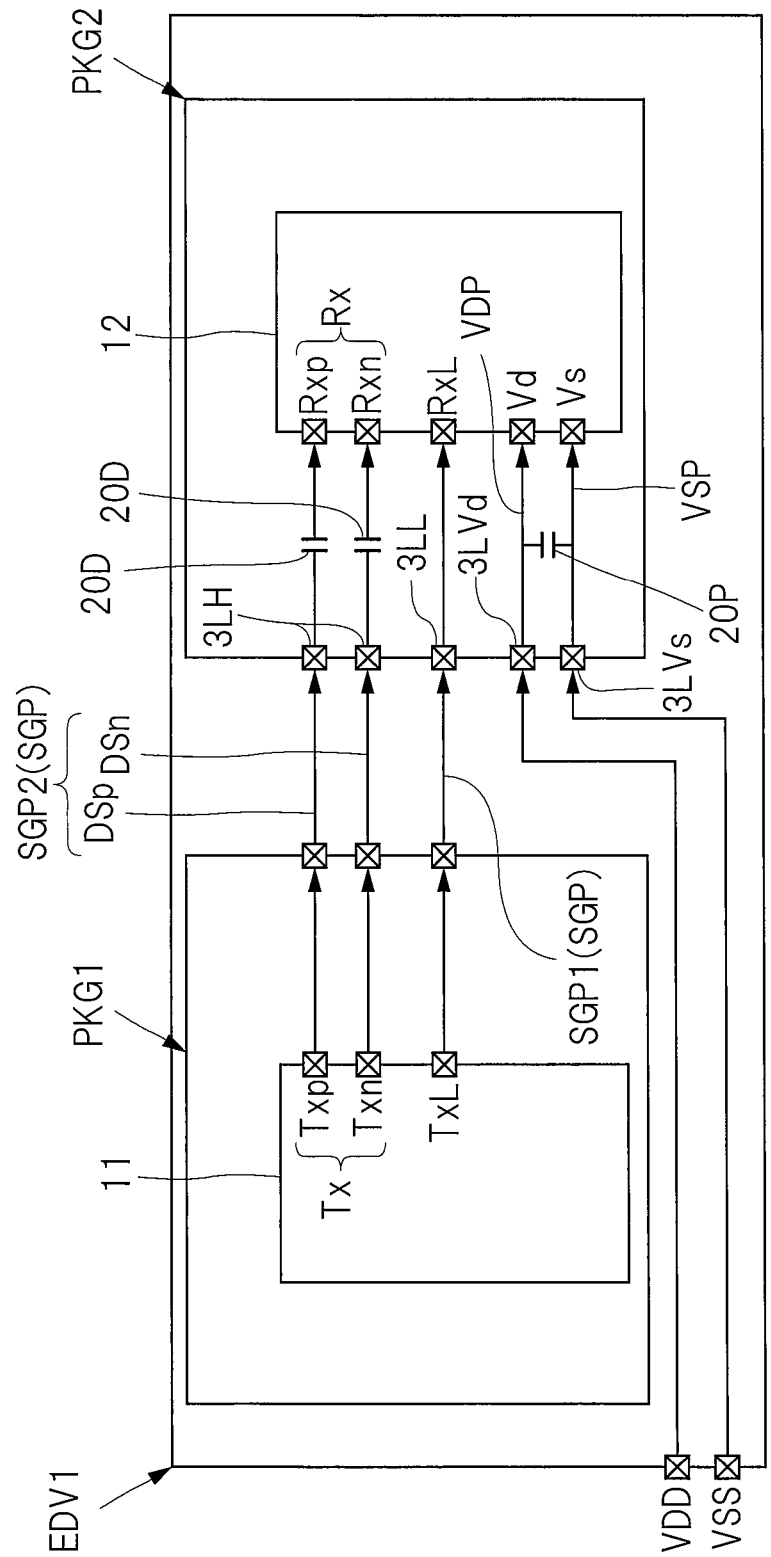
FIG. 2 is an explanatory diagram illustrating an exemplary configuration of a circuit included in the electronic device illustrated in FIG. 1.

First, an exemplary configuration of an electronic device in which a plurality of semiconductor devices (semiconductor packages) are mounted on a motherboard and an electric signal is transmitted between the plurality of semiconductor devices will be described with reference to FIG. 1 and FIG. 2. FIG. 1 is an explanatory diagram illustrating an exemplary configuration of an electronic device including a semiconductor device according to the present embodiment. Also, FIG. 2 is an explanatory diagram illustrating an exemplary configuration of a circuit included in the electronic device illustrated in FIG. 1. Note that, in order to explicitly illustrate that a semiconductor device PKG1 and a semiconductor device PKG2 are electrically connected with each other, a high speed transmission path SGP2 illustrated in FIG. 2 is schematically illustrated in a bold line in FIG. 1.

An electronic device (electronic equipment) EDV1 illustrated in FIG. 1 includes a wiring board (motherboard, mounting board) MB1, a semiconductor device PKG1 mounted on the wiring board MB1, and a semiconductor device PKG2 mounted on the wiring board MB1. The semiconductor device PKG1 and the semiconductor device PKG2 are electrically connected with each other via a signal transmission path SGP formed in the wiring board MB1.

Specifically, as illustrated in FIG. 2, the electronic device EDV1 includes a plurality of the signal transmission paths SGP. In an example illustrated in FIG. 2, the plurality of signal transmission paths SGP include a low speed transmission path SGP1 through which an electric signal is transmitted at a first transmission speed and include a high speed transmission path SGP2 through which an electric signal is transmitted at a second transmission speed higher than the first transmission speed. Also, in the example illustrated in FIG. 2, the high speed transmission path SGP2 includes a pair of differential signal transmission paths DSp and DSn through which differential signals are transmitted.

Note that the present embodiment will be described taking, as an example of the high speed transmission path SGP2, an implementation mode in which differential signals are transmitted through the pair of differential signal transmission paths DSp and DSn; however, a type of high speed signals includes signals other than the differential signal as various modifications. For example, high speed transmission can be achieved by increasing a frequency even in the case of using one signal transmission path SGP, that is, a single-ended structure.

Also, in the example illustrated in FIG. 2, a semiconductor chip 11 included in the semiconductor device PKG1 has an electrode (electrode pad) TxL for low speed signal transmission, which is transmitted at the first transmission speed, formed therein, for example. Moreover, the semiconductor chip 11 has an electrode (electrode pad) Tx (more specifically, an electrode Txp and an electrode Txn to which a pair of differential signals is output) for high speed signal transmission, which is transmitted at the second transmission speed higher than the first transmission speed, formed therein, for example.

Meanwhile, a semiconductor chip 12 included in the semiconductor device PKG2 has an electrode (electrode pad) RxL for low speed signal reception, transmitted at the first transmission speed, formed therein. Moreover, the semiconductor chip 12 has an electrode (electrode pad) Rx (more specifically, an electrode Rxp and an electrode Rxn to which a pair of differential signals is input) for high speed signal reception, transmitted at the second transmission speed higher than the first transmission speed, formed therein, for example.

Then, the electrode TxL and the electrode RxL are electrically connected to form the low speed transmission path SGP1 through which an electric signal is transmitted at a transmission speed below 3 Gbps (gigabits per second), for example. Also, the electrode Tx and the electrode Rx are electrically connected to form the high speed transmission path SGP2 through which an electric signal is transmitted at a transmission speed of substantially 3 Gbps to 100 Gbps, for example.

In high speed signal transmission like the electronic device EDV1, it is preferable to connect a capacitor 20D in series in the high speed transmission path SGP2. A DC component contained in an AC signal can be cut off (in other words, the DC component can be blocked) by the capacitor 20D inserted into the high speed transmission path SGP2. This makes it possible to stabilize input and output of signals at high speed. Thus, the capacitor 20D inserted into the signal transmission path in series connection to cut off the DC component in the AC signal is referred to as a direct current (DC) cut-off capacitor or an alternate current (AC) coupling capacitor, or a DC blocking capacitor (hereinafter referred to as the DC cut-off capacitor).

The capacitor 20D serving as the DC cut-off capacitor is distinguished from a capacitor 20P for a power supply circuit, to be inserted into a power supply circuit in parallel connection as exemplified by the capacitor 20P illustrated in FIG. 2. The capacitor 20P illustrated in FIG. 2 is inserted between a reference potential supply path VSP through which a reference potential (first potential) VSS is supplied to the semiconductor chip 12, and a power supply potential supply path VDP through which a power supply potential (second potential) VDD is supplied to the semiconductor chip 12. The capacitor 20P can function as a bypass capacitor that bypasses a noise (signal) included in the power supply potential supply path VDP to be directed to the reference potential supply path VSP side. The capacitor 20P can also function as a decoupling capacitor that reduces a loop (path distance) of the current flowing through a circuit formed in the semiconductor chip 12 to reduce an influence of an impedance component included in the power supply potential supply path VDP and the reference potential supply path VSP. The capacitor 20P can also function as a battery that suppress a phenomenon in which a drive voltage instantaneously drops by connecting the capacitor 20P in the vicinity of a circuit that consumes supplied electric power.

The above-described capacitor 20P for the power supply circuit, serving as the bypass capacitor, the decoupling capacitor, or the battery, is inserted into the power supply circuit in parallel connection in any case. In contrast, the capacitor 20D is inserted into the signal transmission path SGP in series connection. Accordingly, as illustrated in FIG. 2, in a case where the high speed transmission path SGP2 includes the differential signal transmission paths DSp and DSn, the capacitor 20D is inserted into each of the differential signal transmission path DSp and the differential signal transmission path DSn.

Note that a state in which the capacitor is connected in series in the wiring path (signal transmission path or potential supply path) and a state in which the capacitor is connected in parallel in the wiring path (signal transmission path or potential supply path) can be defined as follows. That is, the capacitor includes two electrodes and can be defined by a connection destination of a wiring connected to these two electrodes. For example, in an example illustrated in FIG. 2, one electrode of the capacitor 20D is connected to the electrode Rx of the semiconductor chip 12 via a first wiring. Also, the other electrode of the capacitor 20D is connected to a land 3LH via a second wiring different from the first wiring. Then, the land 3LH and the electrode Rx of the semiconductor chip 12 are electrically connected with each other via the capacitor 20D. This case indicates that the capacitor 20D is connected in series in the wiring path electrically connecting the electrode Rx of the semiconductor chip 12 to the land 3LH.

Meanwhile, one electrode of the capacitor 20P is connected to each of an electrode Vd of the semiconductor chip 12 and a land 3LVd via a first wiring. Also, the other electrode of the capacitor 20P is connected to an electrode Vs of the semiconductor chip 12 and a land 3LVs via a second wiring different from the first wiring. This case indicates that the capacitor 20P is connected in parallel between the wiring path through which the power supply potential is supplied to the semiconductor chip 12 and the wiring path through which the reference potential is supplied to the semiconductor chip 12.

As described above, it is sufficient if at least one or more capacitors 20D serving as the DC cut-off capacitor are inserted into the high speed transmission path SGP2. Therefore, for example, the capacitor 20D can also be mounted over the wiring board MB1 illustrated in FIG. 1. The DC cut-off capacitors, however, need to be mounted corresponding to the number of high speed transmission paths SGP2. For example, in the case of a single-ended high speed transmission path, the same number of capacitors 20D as the number of high speed transmission paths is needed. In another case of the high speed transmission path SGP2 through which differential signals are transmitted as illustrated in FIG. 2, one capacitor 20D (total of two) is needed for each of the differential pair of the high speed transmission paths SGP2.

In a case where a large number of capacitors 20D are mounted over the wiring board MB1 in this manner, layout of the wirings constituting the high speed transmission path SGP2 among the plurality of wirings formed in the wiring board MB1 becomes complicated. Moreover, the complicated wiring layout makes it difficult to miniaturize the electronic device EDV1.

Moreover, from the viewpoint of reducing crosstalk noise, the high speed transmission path SGP2 is preferably configured such that the wiring constituting the high speed transmission path SGP2 is formed in an inner layer of the wiring board MB1 illustrated in FIG. 1 (wiring layer formed inside the wiring layer where a terminal for mounting the semiconductor devices PKG1 and PKG2 is formed). In a case where the capacitor 20D is mounted over the wiring board MB1, however, in order to electrically connect the capacitor 20D with the high speed transmission path SGP2, there is a need to achieve a connection through an interlayer conductive path electrically connecting between stacked wiring layers, such as vias and through-holes (not illustrated). The interlayer conductive paths such as the vias and the through-holes may cause impedance discontinuity in the high speed transmission path SGP2. Therefore, from the viewpoint of enhancing electrical characteristics of the high speed transmission path SGP2, it is preferable to reduce the number of interlayer conductive paths included in the high speed transmission path SGP2.

In this regard, the inventors of the present application have examined a technique of mounting the capacitor 20D serving as the DC cut-off capacitor in the semiconductor device PKG2 as illustrated in FIG. 1. By mounting the capacitor 20D in the semiconductor device PKG2, layout of the wirings formed in the wiring board MB1 can be simplified. This leads to miniaturization of the wiring board MB1.

Moreover, by mounting the capacitor 20D in the semiconductor device PKG2, it is possible to reduce the number of interlayer conductive paths inserted into the high speed transmission path SGP2 of the wiring board MB1. This enhances the electrical characteristics of the high speed transmission path SGP2.

Note that, in the present embodiment, as illustrated in FIG. 1, among the semiconductor device PKG1 having a circuit for transmission and the semiconductor device PKG2 having a circuit for reception, the capacitor 20D is mounted in the semiconductor device PKG2 having the circuit for reception. Note that, as described above, it is sufficient if one or more capacitors 20D are inserted into the high speed transmission path SGP2. Therefore, as a modification to FIG. 1, the capacitor 20D may be mounted in the semiconductor device PKG1 having the circuit for transmission without providing the capacitor 20D in the semiconductor device PKG2. Alternatively, as another modification to FIG. 1, it is also possible to mount the capacitor 20D in both the semiconductor device PKG1 and the semiconductor device PKG2.

<Semiconductor Device>

Figure 3:
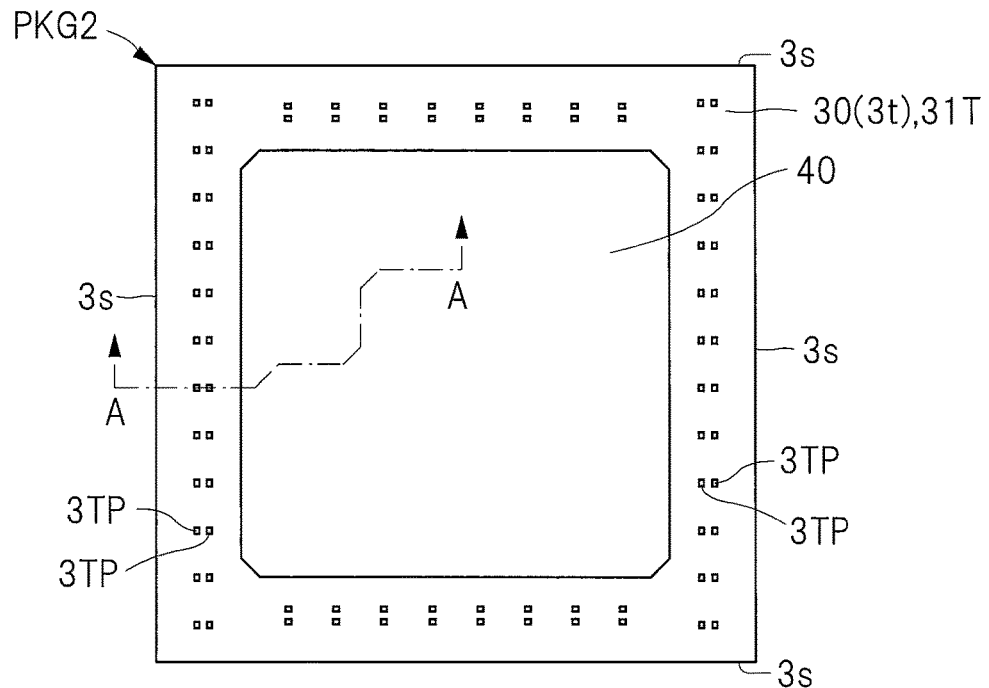
FIG. 3 is a top view of a semiconductor device having a DC cut-off capacitor among the plurality of semiconductor devices illustrated in FIG. 1.
Figure 4:
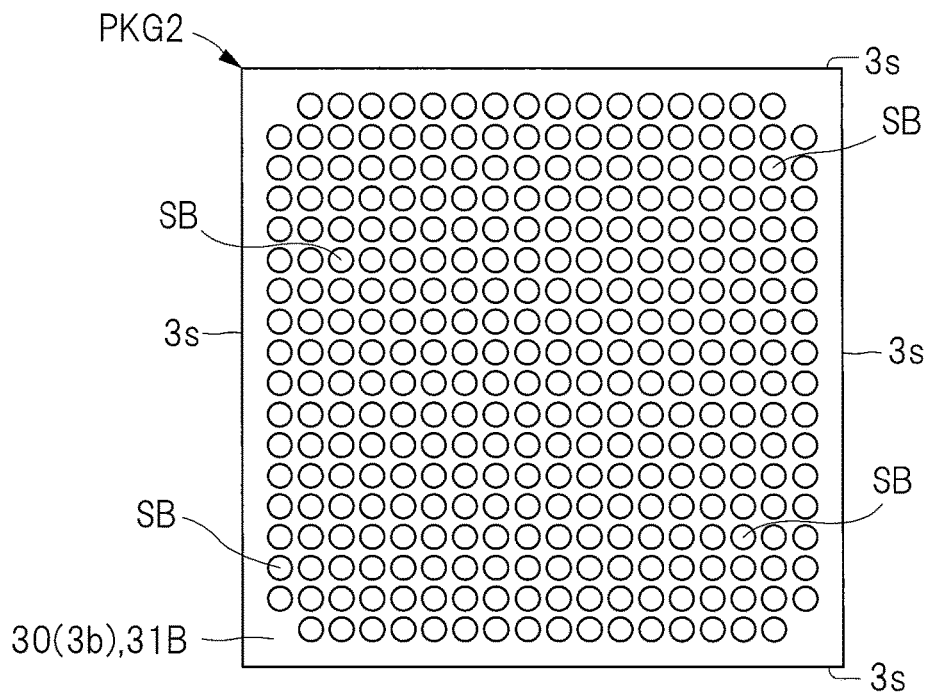
FIG. 4 is a bottom view of the semiconductor device illustrated in FIG. 3.

Next, an implementation mode in which the DC cut-off capacitor 20D is mounted in the semiconductor device PKG2 will be described in detail using the semiconductor device PKG2 illustrated in FIG. 1 as an example. FIG. 3 is a top view of the semiconductor device having the DC cut-off capacitor among the plurality of semiconductor devices illustrated in FIG. 1. Also, FIG. 4 is a bottom view of the semiconductor device illustrated in FIG. 3. Also, FIG. 5 is a plan view illustrating a positional relation between the plurality of capacitors and the semiconductor chip, seen through a heat dissipation plate from a side of the top view of the wiring substrate illustrated in FIG. 3. Also, FIG. 6 is an enlarged cross-sectional view taken along a line A-A of FIG. 3.

Figure 6:
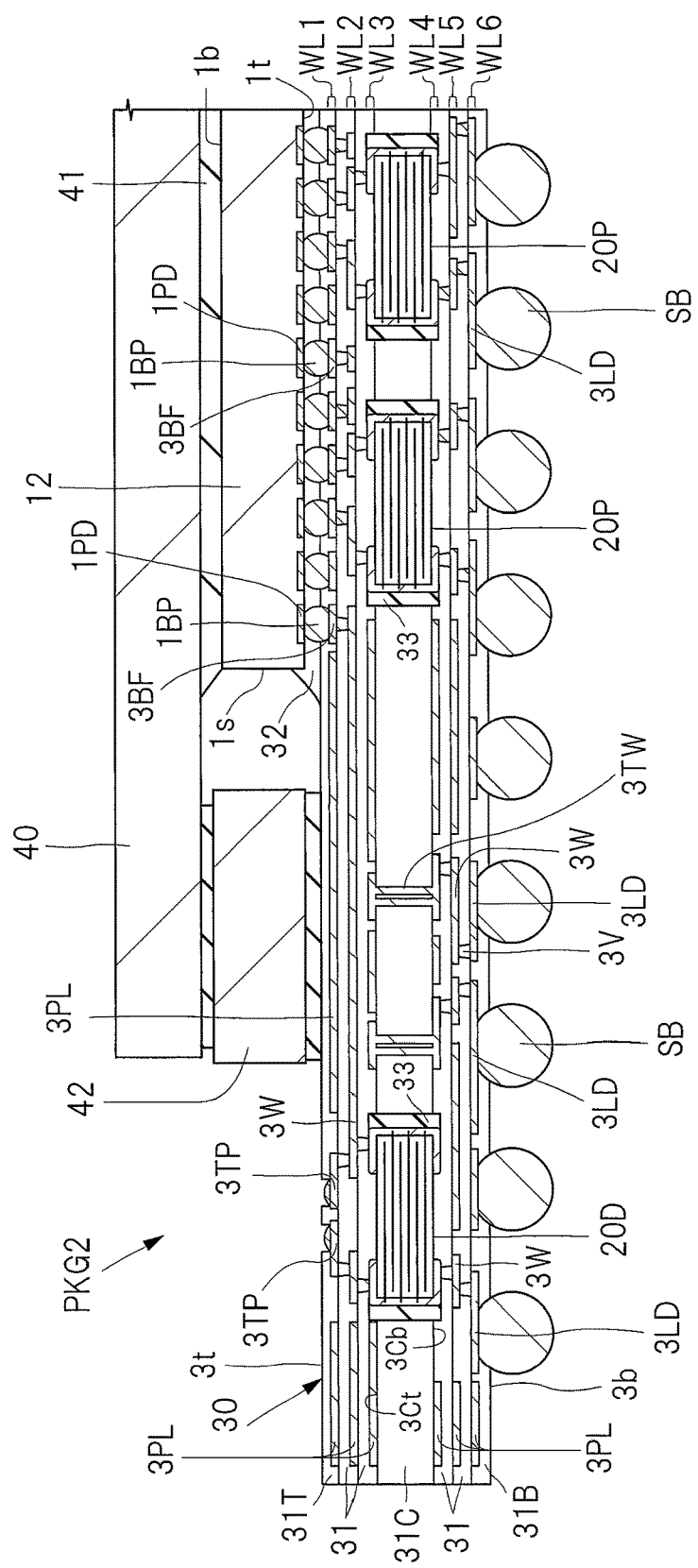
FIG. 6 is a cross-sectional view taken along a line A-A of FIG. 3.

Note that FIG. 3 to FIG. 6 are illustrated in a state where the number of terminals is reduced for viewability. The number of terminals (terminals 3BF, lands 3LD, and solder balls SB) is not limited to the mode illustrated in FIG. 3 to FIG. 6. For example, application is possible to a semiconductor device in which the number of terminals of each of the terminals 3BF, the lands 3LD, the solder balls SB is substantially 100 to 10,000. Also, in FIG. 5, in order to clarify a planar positional relation between the plurality of capacitors and the semiconductor chip, an outline of each of the plurality of capacitors incorporated in the wiring substrate 30 is indicated by a dotted line. In addition, although FIG. 5 is a plan view, in order to easily distinguish between the capacitor 20D and the capacitor 20P among the plurality of capacitors, each of the plurality of capacitors 20P is hatched. Also, although FIG. 6 is a cross-sectional view, hatching is omitted for each of a plurality of insulating layers 31 and an underfill resin for viewability.

First, a schematic configuration of the semiconductor device PKG2 of the present embodiment will be described with reference to FIG. 3 to FIG. 6. The semiconductor device PKG2 of the present embodiment includes the wiring substrate 30, the semiconductor chip 12 (see FIG. 5) mounted over the wiring substrate 30, and the plurality of capacitors 20D and 20P incorporated in the wiring substrate 30.

As illustrated in FIG. 6, the wiring substrate 30 includes an upper surface (surface, main surface, chip mounting surface) 3t over which the semiconductor chip 12 is mounted, a lower surface (surface, main surface, mounting surface) 3b on an opposite side to the upper surface 3t, and a plurality of side surfaces 3s (see FIG. 3 to FIG. 5) arranged between the upper surface 3t and the lower surface 3b, and has a quadrangular outer shape in plan view as illustrated in FIG. 4 and FIG. 5. In the examples illustrated in FIG. 4 and FIG. 5, a planar size (dimensions in plan view, dimensions of each of the upper surface 3t and the lower surface 3b, or outer size) of the wiring substrate 30 is represented by a square or a rectangle having a side length of substantially 12 mm to 60 mm. Also, a thickness (height) of the wiring substrate 30, that is, a distance from the upper surface 3t to the lower surface 3b illustrated in FIG. 6 is substantially 0.3 mm to 1.3 mm, for example.

The wiring substrate 30 is an interposer (relay substrate) electrically connecting the semiconductor chip 12 mounted on the upper surface 3t side to the wiring board MB1 serving as a motherboard (mounting board) illustrated in FIG. 1. The wiring substrate 30 includes a plurality of wiring layers (six layers in the example in FIG. 6) WL1, WL2, WL3, WL4, WL5, and WL6 electrically connecting the upper surface 3t side serving as the chip mounting surface with the lower surface 3b side serving as the mounting surface. Each of the wiring layers includes a conductor pattern such as a wiring as a path through which an electric signal and electric power are supplied, and is covered with the insulating layer 31 insulating a plurality of paths. In addition, the wiring layers adjacent to each other in a thickness direction are electrically connected via interlayer conductive paths such as a via wiring 3V and a through-hole wiring 3TW.

Also, among the plurality of wiring layers, most of the wiring layer WL1 arranged closest to the upper surface 3t side is covered with an insulating layer 31T serving as a solder resist film. Moreover, among the plurality of wiring layers, most of the wiring layer WL6 arranged closest to the lower surface 3b side is covered with an insulating layer 31B serving as a solder resist film.

Also, the wiring substrate 30 is formed by stacking a plurality of wiring layers over each of an upper surface 3Ct and a lower surface 3Cb of an insulating layer (core material, core insulating layer) 31C which is made of a prepreg, for example, in which a glass fiber is impregnated with resin, by a build-up method. Also, the wiring layer WL3 on the upper surface 3Ct side of the insulating layer 31C and the wiring layer WL4 on the lower surface 3Cb side are electrically connected with each other via a plurality of the through-hole wirings 3TW buried in a plurality of penetrating holes (through-holes) provided so as to penetrate from one of the upper surface 3Ct and the lower surface 3Cb to the other.

A plurality of terminals (bonding pads, bonding leads, chip connection terminals) 3BF electrically connected with the semiconductor chip 12 are formed in the upper surface 3t of the wiring substrate 30. Also, a plurality of lands 3LD serving as external input/output terminals of the semiconductor device PKG2 are formed in the lower surface 3b of the wiring substrate 30. The plurality of terminals 3BF and the plurality of lands 3LD are electrically connected with each other via the wiring 3W, the via wiring 3V, and the through-hole wiring 3TW, formed in the wiring substrate 30.

Note that, in the example illustrated in FIG. 6, the wiring substrate 30 indicates a wiring substrate in which a plurality of wiring layers are stacked over each of the upper surface 3Ct and the lower surface 3Cb of the insulating layer 31C serving as the core material. Alternatively, as a modification to FIG. 6, it is applicable to use a so-called coreless substrate formed by sequentially stacking conductor patterns such as the insulating layer 31 and the wiring 3W without having the insulating layer 31C made of a hard material such as a prepreg material. In a case where the coreless substrate is used, the through-hole wiring 3TW is not formed, and each of the wiring layers is electrically connected via the via wiring 3V. Also, while FIG. 6 illustrates an exemplary case where the wiring substrate 30 having six wiring layers is used, as a modification, a wiring substrate having seven or more wiring layers, or five wiring layers or less, may be used, for example.

Also, each of the wiring layers WL1, WL2, WL3, WL4, and WL6 includes a conductor plane (pattern) 3PL formed so as to surround the conductor patterns such as the wiring 3W, the via wiring 3V, the through-hole wiring 3TW, and the land 3LD. The conductor plane 3PL is a conductor pattern formed in a region where the conductor patterns such as wirings for signal transmission and terminals are not formed, and constitutes a part of the supply path of the reference potential or the power supply potential. Also, the conductor plane 3PL is provided spaced apart from the conductor patterns such as the wiring 3W, the via wiring 3V, the through-hole wiring 3TW, and the land 3LD.

Forming the conductor plane 3PL in each of the wiring layers in this manner can suppress spread of an electric field and a magnetic field from the signal transmission path to the surroundings at the time of signal transmission and suppress crosstalk noise from other signals. This makes it possible to enhance noise resistance of the signal transmission path. In particular, in a case where a high speed transmission path through which a signal is transmitted at a transmission speed of 3 Gbps or more is included as in the present embodiment, it is preferable to enhance noise resistance by forming a conductor plane. In addition, the conductor plane 3PL may constitute a reference path (return path) of the signal transmission path.

Also, in the example illustrated in FIG. 6, a solder ball (solder material, external terminal, electrode, and external electrode) SB is connected to each of the plurality of lands 3LD. The solder ball SB is a conductive member electrically connecting a plurality of terminals (not illustrated) on the wiring board MB1 side with the plurality of lands 3LD upon mounting the semiconductor device PKG2 on the wiring board MB1 illustrated in FIG. 1. The solder ball SB is a Sn—Pb solder material containing lead (Pb), or a solder material formed of a lead-free solder substantially not containing Pb. Examples of the lead-free solder include only tin (Sn), tin-bismuth (Sn—Bi), tin-copper-silver (Sn—Cu—Ag), and tin-copper (Sn—Cu). In this case, the lead-free solder means that a content of lead (Pb) is 0.1 wt % or less, being defined as the standard of the restriction of hazardous substances (RoHS).

Moreover, as illustrated in FIG. 4, the plurality of solder balls SB are arranged in rows and columns (in an array or a matrix). Although not illustrated in FIG. 4, the plurality of lands 3LD (see FIG. 6) bonded to the plurality of solder balls SB are also arranged in rows and columns (in a matrix). The semiconductor device having a plurality of external terminals (solder balls SB and lands 3LD) arranged in rows and columns on the mounting surface side of the wiring substrate 30 is referred to as an area array type semiconductor device. The area array type semiconductor device can effectively utilize the mounting surface (lower surface 3b) side of the wiring substrate 30 as an arrangement space of the external terminals, and therefore, this is preferable in that an increase of the mounting area of the semiconductor device can be suppressed even when the number of external terminals increases. That is, a semiconductor device with an increased number of external terminals along with higher functionality and higher integration can be mounted in a reduced space.

Moreover, the semiconductor device PKG2 includes the semiconductor chip 12 mounted over the wiring substrate 30. As illustrated in FIG. 6, each of the semiconductor chips 12 includes a front surface (main surface, upper surface) 1t, a back surface (main surface, lower surface) 1b on an opposite side to the front surface 1t, and a side surface is located between the front surface 1t and the back surface 1b, and has a quadrangular outer shape having a planar area smaller than that of the wiring substrate 30 in plan view as illustrated in FIG. 5. In the example illustrated in FIG. 5, the semiconductor chip 12 is mounted over the upper surface 3t of the wiring substrate 30 in a state where each of the four side surfaces is is along each of the four side surfaces 3s of the wiring substrate 30.

Moreover, as illustrated in FIG. 6, a plurality of pads (electrode pad, bonding pads) 1PD are formed on the front surface 1t side of the semiconductor chip 12. The plurality of pads 1PD are exposed from a passivation film that protects the front surface 1t of the semiconductor chip 12, in the front surface 1t of the semiconductor chip 12. In the present embodiment, the plurality of pads 1PD are arranged in rows and columns (in an array or a matrix) in the front surface 1t of the semiconductor chip 12. Arranging the plurality of pads 1PD serving as electrodes of the semiconductor chip 12 in rows and columns makes it possible to effectively utilize the front surface 1t of the semiconductor chip 12 as an electrode arrangement space, and thus, this arrangement is preferable in that an increase in planar area can be suppressed even when the number of electrodes of the semiconductor chip 12 is increased. Although not illustrated, as a modification to the present embodiment, application is also possible to a semiconductor chip having the plurality of pads 1PD formed along each of the sides constituting the peripheral edges of the front surface 1t.

Also, in the example illustrated in FIG. 6, the semiconductor chip 12 is mounted over the wiring substrate 30 in a state where the front surface 1t is arranged to face the upper surface 3t of the wiring substrate 30. This mounting method is referred to as a facedown mounting method or a flip-chip connecting method.

Also, although not illustrated, a plurality of semiconductor elements (circuit elements) are formed in the main surface of the semiconductor chip 12 (specifically, a semiconductor element formation region provided in an element formation surface of a semiconductor substrate as a base material of the semiconductor chip 12). Each of the plurality of pads 1PD is electrically connected with each of the plurality of semiconductor elements via a wiring (not illustrated) formed in a wiring layer arranged inside the semiconductor chip 12 (specifically, between the front surface 1t and the semiconductor element formation region not illustrated).

The semiconductor chip 12 (specifically, the base material of the semiconductor chip 12) is made of silicon (Si), for example. Moreover, an insulating film covering the base material and the wiring of the semiconductor chip 12 is formed over the front surface 1t, and a part of each of the plurality of pads 1PD is exposed from the insulating film in an opening formed in the insulating film. Also, each of the plurality of pads 1PD is made of a metal, for example, aluminum (Al) in the present embodiment.

Also, as illustrated in FIG. 6, each of the plurality of pads 1PD is connected to a projecting electrode 1BP, and the plurality of pads 1PD of the semiconductor chip 12 are electrically connected with the plurality of terminals 3BF of the wiring substrate 30 via the plurality of projecting electrodes 1BP, respectively. The projecting electrode (bump electrode) 1BP is a metal member (conductive member) formed so as to protrude on the front surface 1t of the semiconductor chip 12. According to the present embodiment, the projecting electrode 1BP is a so-called solder bump in which a solder material is stacked over the pad 1PD via an underlying metal film (under-bump metal). The underlying metal film is, for example, a stacked film formed by stacking titanium (Ti), copper (Cu), and nickel (Ni) from the connection surface side with the pad 1PD (in which a gold (Au) film might be further formed over the nickel film, in some cases). Also, as the solder material constituting the solder bump, a solder material containing lead or a lead-free solder can be used similarly to the solder ball SB described above. When the semiconductor chip 12 is mounted over the wiring substrate 30, solder bumps are formed beforehand on both of the plurality of pads 1PD and the plurality of terminals 3BF, and then, heat treatment (reflow treatment) is applied to the solder bumps in a state where the solder bumps are brought into contact with each other, whereby the solder bumps are integrated to form the projecting electrode 1BP. In addition, as a modification to the present embodiment, a pillar bump (columnar electrode) in which a solder film is formed on a tip surface of a conductor column made of copper (Cu) or nickel (Ni) may be used as the projecting electrode 1BP.

Moreover, in the present embodiment, the semiconductor chip 12 includes a circuit to and from which a plurality of signals at different transmission speeds are input and output. Although not illustrated, the semiconductor chip 12 includes a first circuit to and from which a first signal at a first transmission speed is input and output, and a second circuit to and from which a second signal at a second transmission speed higher than the first transmission speed is input and output. As the second signal, for example, a differential signal is transmitted at a transmission speed of substantially 3 Gbps (gigabits per second) to 100 Gbps. In the following description, the transmission path through which the second signal is transmitted will be described as a high speed transmission path in the present embodiment. Also, a transmission path through which the first signal is transmitted at the first transmission speed lower than the second transmission speed will be described as a low speed transmission path. Note that, in addition to the first signal, a first drive voltage that drives the first circuit is supplied to the first circuit. Moreover, note that, in addition to the second signal, a second driving voltage that drives the second circuit is supplied to the second circuit.

Also, as illustrated in FIG. 6, an underfill resin (insulating resin) 32 is arranged between the semiconductor chip 12 and the wiring substrate 30. The underfill resin 32 is arranged so as to close a space between the front surface 1t of the semiconductor chip 12 and the upper surface 3t of the wiring substrate 30. In addition, the underfill resin 32 is made of an insulating (non-conductive) material (for example, a resin material) and is arranged so as to seal an electrical connection portion between the semiconductor chip 12 and the wiring substrate 30 (bonding portion of each of the plurality of projecting electrodes 1BP). Thus, by covering the bonding portions between the plurality of projecting electrodes 1BP and the plurality of terminals 3BF with the underfill resin 32, it is possible to relieve a stress generated in the electrical connection portion between the semiconductor chip 12 and the wiring substrate 30. Moreover, it is also possible to relieve a stress generated at each bonding portion between the plurality of pads 1PD and the plurality of projecting electrodes 1BP of the semiconductor chip 12. Furthermore, it is also possible to protect the main surface of the semiconductor chip 12, in which the semiconductor element (circuit element) is formed.

Also, as illustrated in FIG. 5, the semiconductor device PKG2 includes the plurality of capacitors 20D and 20P mounted in the wiring substrate 30. In the example of the present embodiment, the semiconductor device PKG2 includes the plurality of capacitors 20D and 20P incorporated in the wiring substrate 30. Note that the above-described state of being "incorporated in the wiring substrate 30" is defined as follows.

For example, in the example illustrated in FIG. 6, the entire capacitor 20D and the entire capacitor 20P are arranged between the upper surface 3*t* and the lower surface 3*b* of the wiring substrate 30. This case can be considered to be in the state in which the capacitor 20P and the capacitor 20D are incorporated in the wiring substrate 30. In contrast, the semiconductor chip 12 illustrated in FIG. 6 is not present between the upper surface 3*t* and the lower surface 3*b* of the wiring substrate 30. In this case, the semiconductor chip 12 is not incorporated in the wiring substrate 30.

Also, although there is no corresponding component in FIG. 6, there might be a state in which a portion of an electronic component such as a capacitor is arranged between the upper surface 3*t* and the lower surface 3*b* of the wiring substrate 30, and another portion is arranged so as to protrude above the upper surface 3*t* of the wiring substrate 30 or protrude below the lower surface 3*b*, that is, arranged in a position other than the space between the upper surface 3*t* and the lower surface 3*b*. In the present application, this case is determined as a state in which the electronic component is in a state of being not incorporated in the wiring substrate 30.

Moreover, there might be a case where an electrode of an electronic component such as a capacitor is exposed in at least one of the upper surface 3*t* and the lower surface 3*b* of the wiring substrate 30 and a portion (main portion) other than the exposed electrode is arranged between the upper surface 3*t* and the lower surface 3*b*. In the present application, this case is determined as a state in which the electronic component is incorporated in the wiring substrate 30. In other words, in the present application, as long as the main portion (main body) excluding the electrodes and terminals of the electronic component is arranged between the upper surface 3*t* and the lower surface 3*b* of the wiring substrate 30, it is determined as a state in which the electronic component is incorporated in the wiring substrate 30.

Incorporating the capacitor 20D in the wiring substrate 30 and incorporating the capacitor 20P in the wiring substrate 30 have mutually different effects, and details of the effects will be described later.

Also, in the example illustrated in FIG. 6, a heat dissipation plate (heat spreader, member) 40 is attached to the back surface 1*b* of the semiconductor chip 12. The heat dissipation plate 40 is a metal plate having a thermal conductivity higher than that of the wiring substrate 30, for example, and has a function of discharging heat generated in the semiconductor chip 12 to the outside. Moreover, the heat dissipation plate 40 is attached to the back surface 1*b* of the semiconductor chip 12 via an adhesive member (heat dissipation resin) 41. The adhesive member 41 has a higher thermal conductivity than that of the underfill resin 32, for example, by containing a large number of metal particles and fillers (such as alumina).

Also, in the examples illustrated in FIG. 5 and FIG. 6, a support frame (stiffener ring) 42 supporting the heat dissipation plate 40 is fixed around the semiconductor chip 12. The heat dissipation plate 40 is bonded and fixed to the back surface 1*b* of the semiconductor chip 12 and the support frame 42. Fixing the metallic support frame 42 around the semiconductor chip 12 can suppress warping deformation of the wiring substrate 30, and this is preferable from the viewpoint of enhancing mounting reliability. Moreover, by bonding and fixing the heat dissipation plate 40 to the support frame 42 provided so as to surround the semiconductor chip 12, it is possible to increase a planar area of the heat dissipation plate 40. In other words, from the viewpoint of enhancing heat dissipation performance by securing a large surface area of the heat dissipation plate 40 and stably fixing the heat dissipation plate 40 over the semiconductor chip 12, it is preferable to bond and fix the heat dissipation plate 40 to the support frame 42.

Note that, while an implementation mode in which the heat dissipation plate 40 is attached to the back surface 1*b* of the semiconductor chip 12 has been described as an example in the present embodiment, it is also applicable as a modification to the implementation mode in which the heat dissipation plate 40 is omitted to expose the back surface 1*b* of the semiconductor chip 12.

<Capacitor Layout 1>

Next, a connection structure between the wiring substrate 30 and the capacitors 20D and 20P illustrated in FIG. 5 and FIG. 6 will be described in detail. First, in the present section, effects obtained by incorporating, in the wiring substrate 30, each of the plurality of capacitors 20P for a power supply circuit among the plurality of capacitors 20P and 20D illustrated in FIG. 5 will be described.

Figure 7:
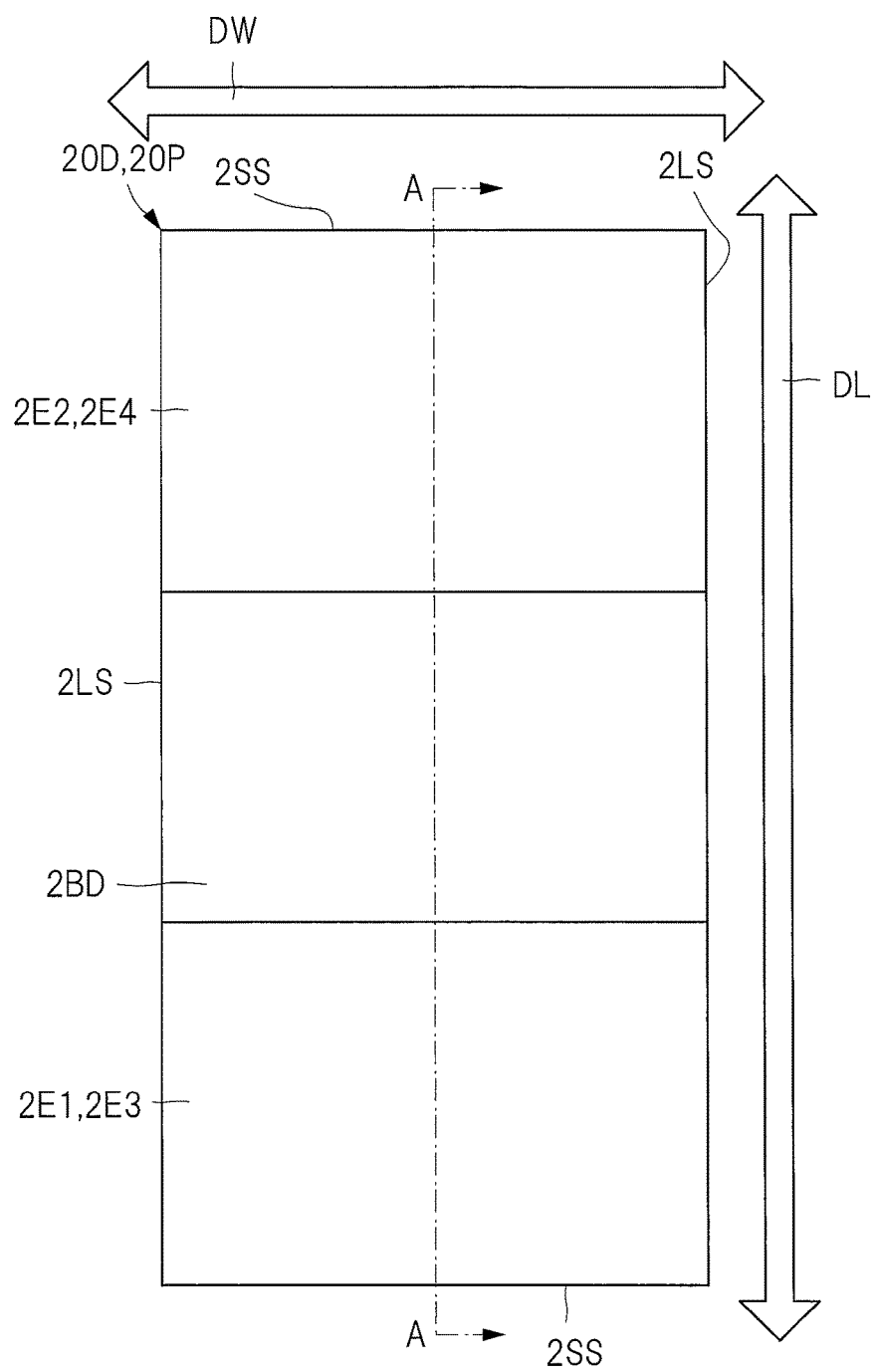
FIG. 7 is a plan view illustrating one of the plurality of capacitors illustrated in FIG. 5.
Figure 8:
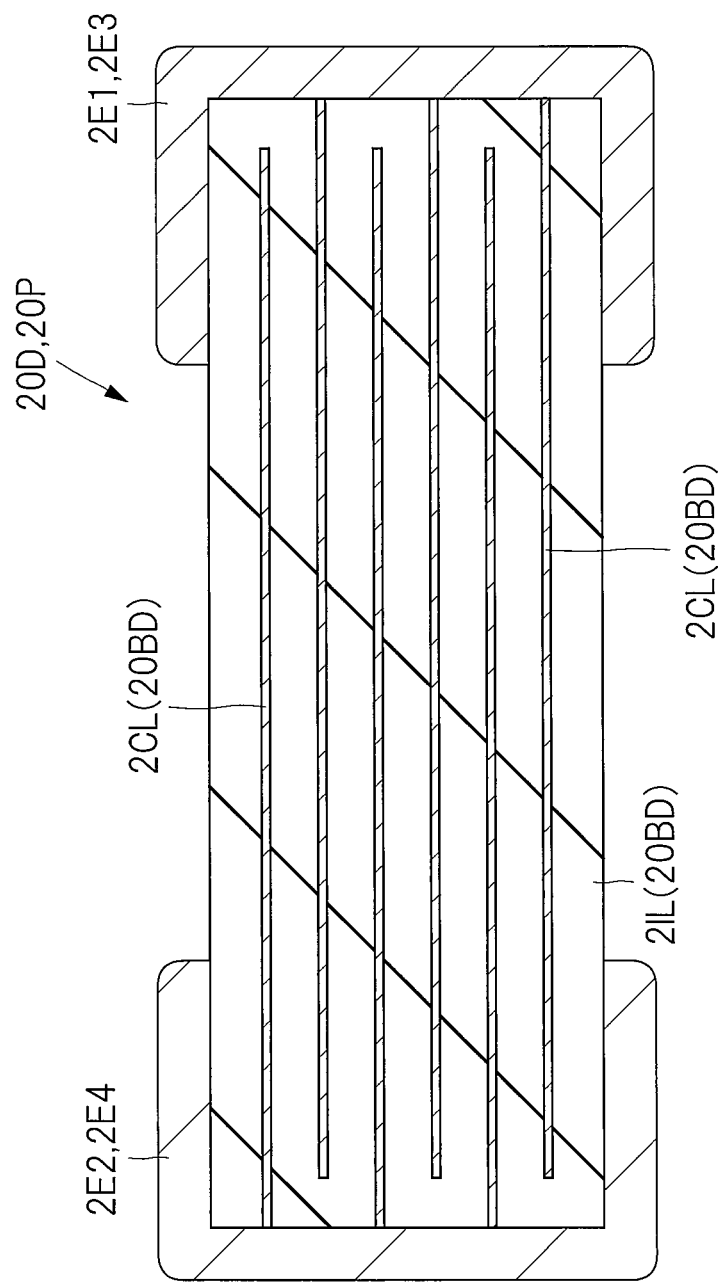
FIG. 8 is a cross-sectional view taken along a line A-A of FIG. 7.
Figure 9:
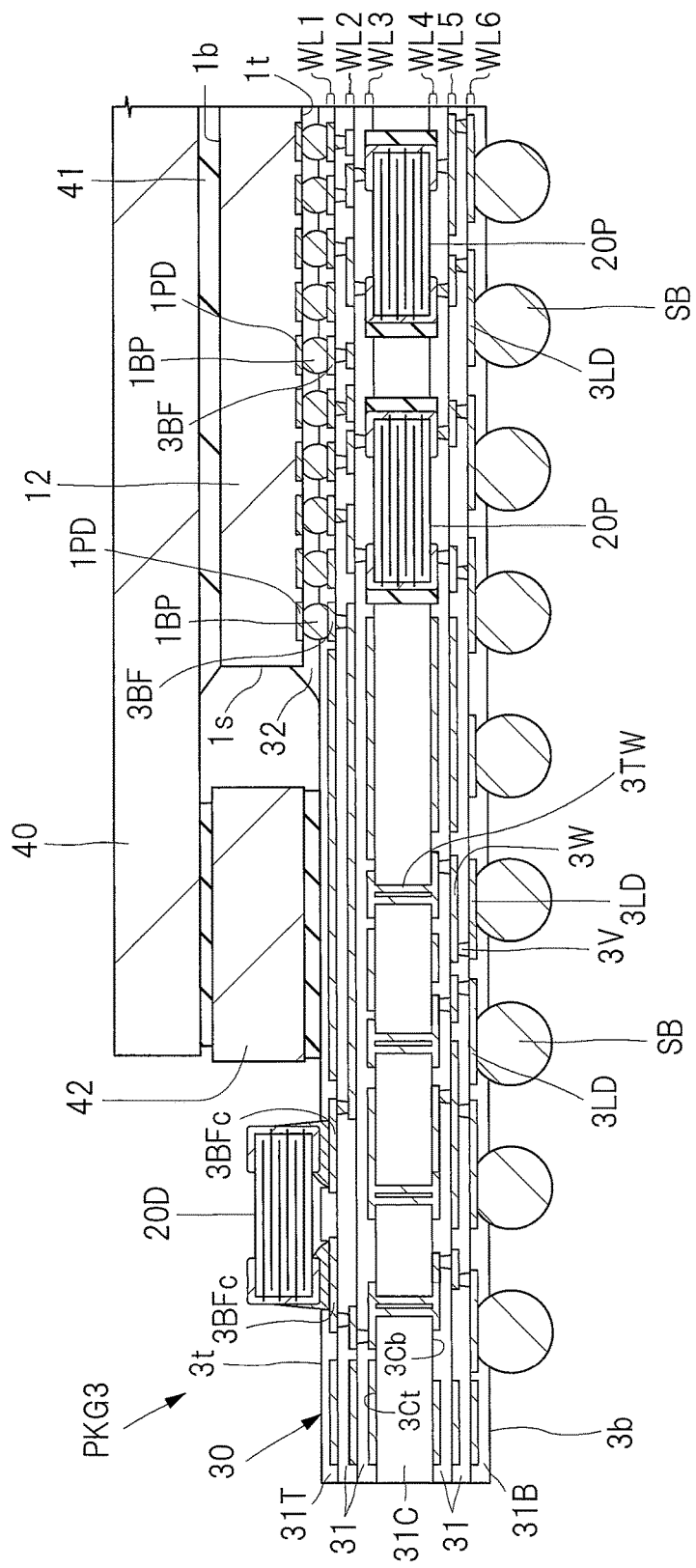
FIG. 9 is an enlarged cross-sectional view of a semiconductor device according to a modification to FIG. 6.

FIG. 7 is a plan view illustrating one of the plurality of capacitors illustrated in FIG. 5. Also, FIG. 8 is a cross-sectional view taken along a line A-A of FIG. 7. Also, FIG. 32 is a plan view illustrating a positional relation between a plurality of capacitors and a semiconductor chip, seen through a heat dissipation plate from a side of an upper surface of a wiring substrate included in a semiconductor device serving as a study example with respect to FIG. 5. Also, FIG. 9 is an enlarged cross-sectional view of a semiconductor device according to a modification to FIG. 6.

Note that the DC cut-off capacitor 20D and a power supply circuit capacitor 20P illustrated in FIG. 5 have a same structure. Accordingly, FIG. 7 and FIG. 8 each illustrate an exemplary structure of a single capacitor as a representative example of the capacitor 20D and the capacitor 20P. Moreover, in FIG. 7, an extending direction DL and a width direction DW of the capacitors 20D and 20P are schematically illustrated with arrows. Also, although FIG. 32 is a plan view similar to FIG. 5, in order to easily distinguish between the capacitor 20D and the capacitor 20P among the plurality of capacitors, each of the plurality of capacitors 20P is hatched.

As illustrated in FIG. 5, the plurality of capacitors 20D and 20P are mounted in the wiring substrate 30 according to the present embodiment. As described above, the plurality of capacitors 20D and 20P include the capacitor 20D serving as the DC cut-off capacitor, and the capacitor 20P for the power supply circuit serving as the bypass capacitor, the decoupling capacitor, or the battery. In FIG. 5, a part of the plurality of capacitors 20D and 20P is indicated with a reference character. In FIG. 5, all of the plurality of capacitors (hatched capacitors) arranged at positions overlapping with the semiconductor chip 12 are the capacitors 20P, while each of the plurality of capacitors 20D is arranged between the plurality of capacitors 20P and the side surface 3*s* of the wiring substrate 30. In the example illustrated in FIG. 5, each of the plurality of capacitors 20D is arranged at a position not overlapping with the semiconductor chip 12. Moreover, in the example illustrated in FIG. 5, the plurality of capacitors 20D are arranged outside the support frame 42.

As illustrated in FIG. 7, each of the capacitors (chip capacitors) 20D and 20P has a quadrangular shape in plan view. Also, each of the capacitors 20D and 20P has two long sides (long side surfaces) 2LS extending along the extending direction (longitudinal direction) DL and two short sides (short side surfaces) 2SS extending along the width direction DW orthogonal to the extending direction DL. Moreover, the capacitors 20D and 20P include an electrode 2E1 and an electrode 2E2 (or an electrode 2E3 and an electrode 2E4) arranged at opposite ends in the extending direction DL (in other words, in the extending direction of the long side 2LS). In addition, each of the capacitors 20D and 20P includes a main body 2BD sandwiched between the electrodes 2E1 and 2E3 and the electrodes 2E2 and 2E4. For example, as illustrated in FIG. 8, the main body 2BD includes a plurality of conductor plates 20CL stacked with an insulating layer (dielectric layer) 20IL interposed therebetween, and each of the plurality of conductor plates 20CL is connected to one of the electrodes 2E1 and 2E3 and one of the electrodes 2E2 and 2E4. The electrodes 2E1 and 2E3 and the electrodes 2E2 and 2E4 function as external electrode terminals to extract a capacitance formed between the plurality of conductor plates 20CL arranged to face each other to the outside. Note that an example of a structure of each of the capacitors 20D and 20P has been described above; however, there are various modifications to the structures of the capacitors 20D and 20P.

For example, the capacitors 20D and 20P in FIG. 7 illustrate an exemplary structure of a capacitor in which the electrodes are arranged so as to cover the short sides 2SS, respectively. However, as a modification, the electrodes may be arranged so as to cover the long sides 2LS, respectively. That is, the electrode of the capacitor may be positioned at any of the short side 2SS and the long side 2LS.

Also, among the plurality of capacitors 20D and 20P illustrated in FIG. 5, each of the plurality of capacitors 20P for the power supply circuit is inserted in parallel connection into the power supply circuit so as to connect the first potential and the second potential of the power supply circuit. That is, the plurality of pads 1PD included in the semiconductor chip 12 illustrated in FIG. 6 include an electrode (electrode pad) Vs (see FIG. 2) to which the reference potential VSS (see FIG. 2) is supplied and an electrode (electrode pad) Vd (see FIG. 2) to which the power supply potential VDD (see to FIG. 2) is supplied. Moreover, the plurality of lands 3LD included in the wiring substrate 30 illustrated in FIG. 6 include a land 3LVs (see FIG. 2) to which the reference potential VSS is supplied and a land 3LVd (see FIG. 2) to which the power supply potential VDD is supplied. Also, as illustrated in FIG. 2, one electrode of the capacitor 20P is connected to a side of the reference potential supply path VSP connecting the electrode Vs to the land 3LVs, while the other electrode of the capacitor 20P is connected to a side of the power supply potential supply path VDP connecting the electrode Vd to the land 3LVd.

In addition, as illustrated in FIG. 5, each of the plurality of capacitors 20P is arranged at a position overlapping with the semiconductor chip 12 in plan view. As illustrated in FIG. 6, each of the plurality of capacitors 20P is incorporated in the wiring substrate 30 in the present embodiment. Therefore, each of the plurality of capacitors 20P can be arranged at a position overlapping with the semiconductor chip 12.

In a case where the plurality of capacitors 20P for the power supply circuit are arranged at the positions overlapping with the semiconductor chip 12 as in the present embodiment, it is possible to reduce a transmission distance between the capacitor 20P and the semiconductor chip 12 compared with the case where the capacitor 20P is arranged around the semiconductor chip 12. Accordingly, with the reduced transmission distance between the capacitor 20P for the power supply circuit and the semiconductor chip 12, it is possible to enhance electrical characteristics of the power supply circuit.

For example, in a case where the capacitor 20P is used as a bypass capacitor, by inserting the capacitor 20P in the vicinity of a circuit that consumes power, it is possible to reduce the noise flowing through the circuit that consumes power. Alternatively, in another case where the capacitor 20P is used as a decoupling capacitor, for example, by reducing the distance between the capacitor 20P and the semiconductor chip 12, it is possible to reduce a loop (path distance) of the current flowing through the circuit formed in the semiconductor chip 12. This leads to the reduction of the influence of the impedance component included in the power supply potential supply path VDP and the reference potential supply path VSP illustrated in FIG. 2. Moreover, in another case where the capacitor 20P is used as a battery, by reducing the distance between the circuit that consumes power and the capacitor 20P, it is easy to suppress the phenomenon in which a drive voltage instantaneously drops.

Moreover, among the plurality of capacitors 20D and 20P, each of the plurality of DC cut-off capacitors 20D is inserted in series connection into the high speed transmission path SGP2 illustrated in FIG. 2. That is, the plurality of pads 1PD included in the semiconductor chip 12 illustrated in FIG. 6 include the electrode (electrode pad) RxL (see FIG. 2) for low speed signals transmitted at a relatively low first transmission speed. Also, the plurality of pads 1PD of the semiconductor chip 12 illustrated in FIG. 6 include the electrodes (electrode pads) Rxp and Rxn (see FIG. 2) for high speed signals transmitted at a second transmission speed higher than the first transmission speed. Also, the plurality of lands 3LD included in the wiring substrate 30 illustrated in FIG. 6 include a land 3LL (see FIG. 2) for low speed signals transmitted at a relatively low first transmission speed. Also, the plurality of lands 3LD included in the wiring substrate 30 illustrated in FIG. 6 include a land 3LH (see FIG. 2) for high speed signals transmitted at the second transmission speed higher than the first transmission speed. In addition, as illustrated in FIG. 2, each of the electrodes Rxp and Rxn is electrically connected with the land 3LH via the capacitor 20D. Specifically, one electrode of the capacitor 20D is connected to the electrode Rxp or the electrode Rxp side of the semiconductor chip 12 of the high speed transmission path SGP2, while the other electrode of the capacitor 20D is connected to the land 3LH side of the high speed transmission path SGP2. More specifically, as illustrated in FIG. 6, one electrode of the capacitor 20D is electrically connected with the pad 1PD of the semiconductor chip 12 via the wiring 3W of the wiring substrate 30. Meanwhile, the other electrode of the capacitor 20D is connected with the land 3LD via another wiring 3W of the wiring substrate 30. When one electrode of the capacitor 20D is connected to the wiring connected with the semiconductor chip and the other electrode of the capacitor 20D is connected to another wiring connected with the land 3LD in this manner, the capacitor 20D is determined as being connected in series within the wiring path connecting the land 3LD and the semiconductor chip 12. In addition, the electrode RxL and the land 3LL included in the low speed transmission path SGP1 illustrated in FIG. 2 are electrically connected with each other, not via the capacitor.

Moreover, in a case where the capacitor 20P for the power supply circuit and the DC cut-off capacitor 20D are mounted in one wiring substrate 30 as in the present embodiment, by arranging the plurality of capacitors 20P for the power supply circuit at the positions overlapping with the semiconductor chip 12 as illustrated in FIG. 5, the following effects can be obtained.

As illustrated in FIG. 5, each of the capacitors 20P for the power supply circuit of the semiconductor device PKG2 of the present embodiment is arranged at the position overlapping with the semiconductor chip 12. In addition, each of the plurality of DC cut-off capacitors 20D included in the semiconductor device PKG2 is arranged between the plurality of capacitors 20P and a peripheral portion (each of sides constituting the peripheral edge of the upper surface 3t) of the wiring substrate 30 in plan view.

As described above, each of the plurality of capacitors 20D is inserted in series connection in the middle of a signal transmission path for a high speed signal (the high speed transmission path SGP2 illustrated in FIG. 2). Therefore, the wiring substrate 30 includes a wiring path that electrically connects each of the plurality of capacitors 20D with the semiconductor chip 12. Accordingly, in order to achieve higher density in the high speed transmission paths, there is a need to arrange these wiring paths at high density.

There is a case, however, where layout of the wiring constituting the high speed transmission path might be obstructed depending on layout of the capacitor 20P for the power supply circuit. For example, as in a semiconductor device PKGh1 which is a modification illustrated in FIG. 32, a case where each of the plurality of capacitors 20P is not incorporated in the wiring substrate 30 but arranged around the semiconductor chip 12 will be examined.

The semiconductor device PKGh1 is different from the semiconductor device PKG2 illustrated in FIG. 5 in that the plurality of capacitors 20P are mounted on the upper surface 3t of the wiring substrate 30 and arranged between the semiconductor chip 12 and the plurality of capacitors 20D. Moreover, the semiconductor device PKGh1 differs from the semiconductor device PKG2 illustrated in FIG. 5 in that each of the plurality of capacitors 20D is mounted on the upper surface 3t of the wiring substrate 30.

In a case where the plurality of capacitors 20P are arranged between the semiconductor chip 12 and the plurality of capacitors 20D in plan view as in the semiconductor device PKGh1, the electrodes 2E3 and 2E4 (see FIG. 7) of the capacitor 20P for the power supply circuit are to be arranged between the semiconductor chip 12 and the capacitor 20D. Accordingly, there is a need to form a terminal for supplying a potential to the capacitor 20P at a position overlapping with each of the electrodes 2E3 and 2E4 of the capacitor 20P among the uppermost wiring layer of the wiring substrate 30. Presence of a terminal for the power supply circuit between the semiconductor chip 12 and the capacitor 20D might interfere with the high speed transmission path. For example, arranging the wiring for the high speed transmission path directly under the terminal for the power supply circuit would increase an influence of the high speed transmission path on the return path. Moreover, in order to increase a separation distance between the wiring of the high speed transmission path and the capacitor 20P to reduce the influence of the terminal for the power supply circuit, there is a need to select a region where the capacitor 20P is not arranged and to form the wiring in the selected region. This makes it difficult to arrange a large number of high speed transmission paths at high density.

To cope with this, the embodiment is configured such that the plurality of capacitors 20P are incorporated in the wiring substrate 30 so as to be arranged at the positions overlapping with the semiconductor chip 12, as illustrated in FIG. 5 and FIG. 6. As illustrated in FIG. 5, each of the plurality of capacitors 20D is arranged between the plurality of capacitors 20P and the peripheral portion (each of sides constituting the peripheral edge of the upper surface 3t) of the wiring substrate 30 in plan view. In other words, each of the plurality of capacitors 20D is arranged around the region where the plurality of capacitors 20P are arranged in plan view.

With this configuration, the capacitor 20D is not arranged in the wiring path connecting the capacitor 20P with the semiconductor chip 12. Therefore, the layout of the high speed transmission path connected to the capacitor 20D can achieve high density without being hindered by the terminals connected to the capacitor 20P.

Moreover, according to the present embodiment, since the capacitor 20P is incorporated in the wiring substrate 30, there is no need to provide a space for mounting the capacitor 20P around the semiconductor chip 12 as in the semiconductor device PKGh1 illustrated in FIG. 32. This can reduce the distance between the semiconductor chip 12 and the capacitor 20D, thereby capable of reducing inductance and resistance of the wiring path connecting the capacitor 20D with the semiconductor chip 12.

As described above, in the case where the capacitor 20P for the power supply circuit and the DC cut-off capacitor 20D are mounted in one wiring substrate 30 as in the present embodiment, by arranging the plurality of capacitors 20P for the power supply circuit at the positions overlapping with the semiconductor chip 12 as illustrated in FIG. 5, it is possible to achieve an effect different from the effects achieved by simply incorporating the capacitor 20P for the power supply circuit, in the wiring substrate 30. In other words, it is possible to achieve an effect different from the effect of reducing the wiring path distance between the semiconductor chip 12 and the capacitor 20P.

Moreover, as illustrated in FIG. 5, an interval between each of the plurality of capacitors 20D and a peripheral edge of the wiring substrate 30 is smaller than an interval between each of the plurality of capacitors 20D and the semiconductor chip 12 in plan view. In other words, each of the plurality of capacitors 20D is arranged close to the peripheral portion side of the upper surface 3t of the wiring substrate 30. In the case of providing a large number of high speed transmission paths, a large number of wiring paths are arranged at high density in a peripheral region of the semiconductor chip 12. Therefore, by arranging each of the plurality of capacitors 20D close to the peripheral portion side of the upper surface 3t of the wiring substrate 30, it is possible to enhance the arrangement density of the high speed transmission path in the region in the vicinity of the semiconductor chip 12.

Each of the plurality of effects described in the present section can be obtained regardless of whether each of the plurality of capacitors 20D is incorporated in the wiring substrate 30. Therefore, like a semiconductor device PKG3 illustrated in FIG. 9 as a modification to FIG. 6, each of the plurality of capacitors 20P may be incorporated in the wiring substrate 30, and a part or all of the plurality of capacitors 20D may be mounted on the upper surface 3t of the wiring substrate 30.

<Capacitor Layout 2>

Figure 10:
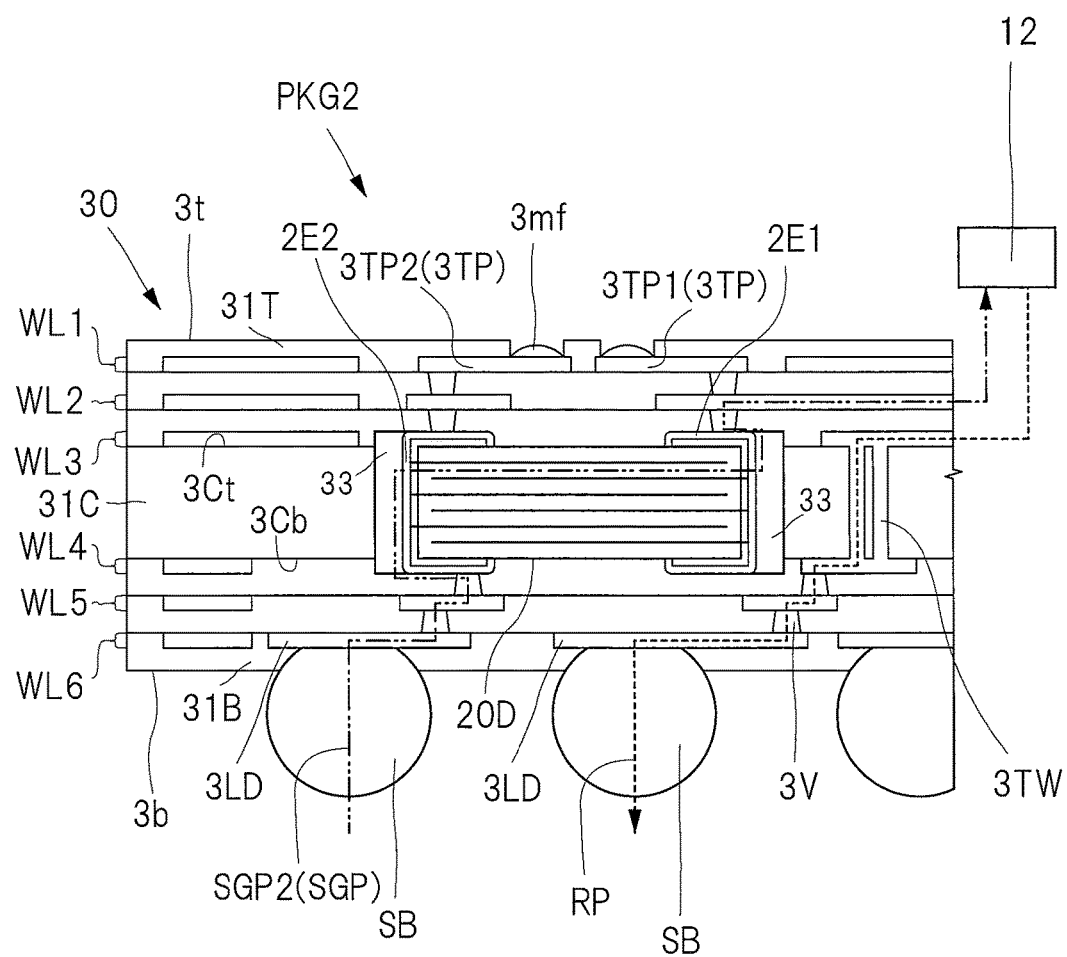
FIG. 10 is an enlarged cross-sectional view schematically illustrating an exemplary signal transmission path connected to the DC cut-off capacitor illustrated in FIG. 5.
Figure 11:
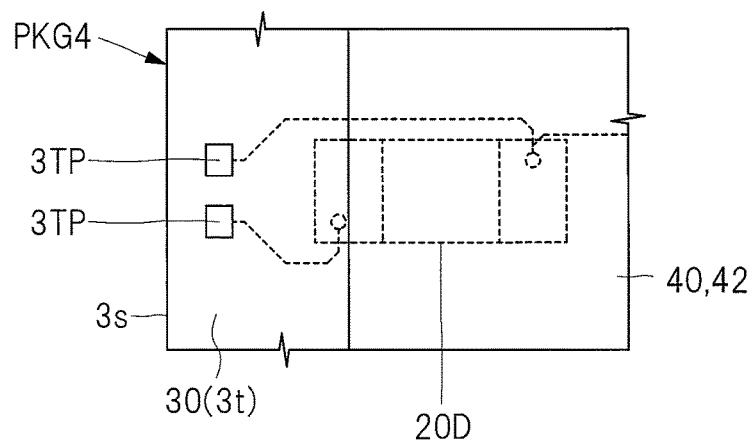
FIG. 11 is an enlarged plan view enlarging a periphery of a region where a DC cut-off capacitor of a semiconductor device according to a modification to FIG. 5 is incorporated.
Figure 12:
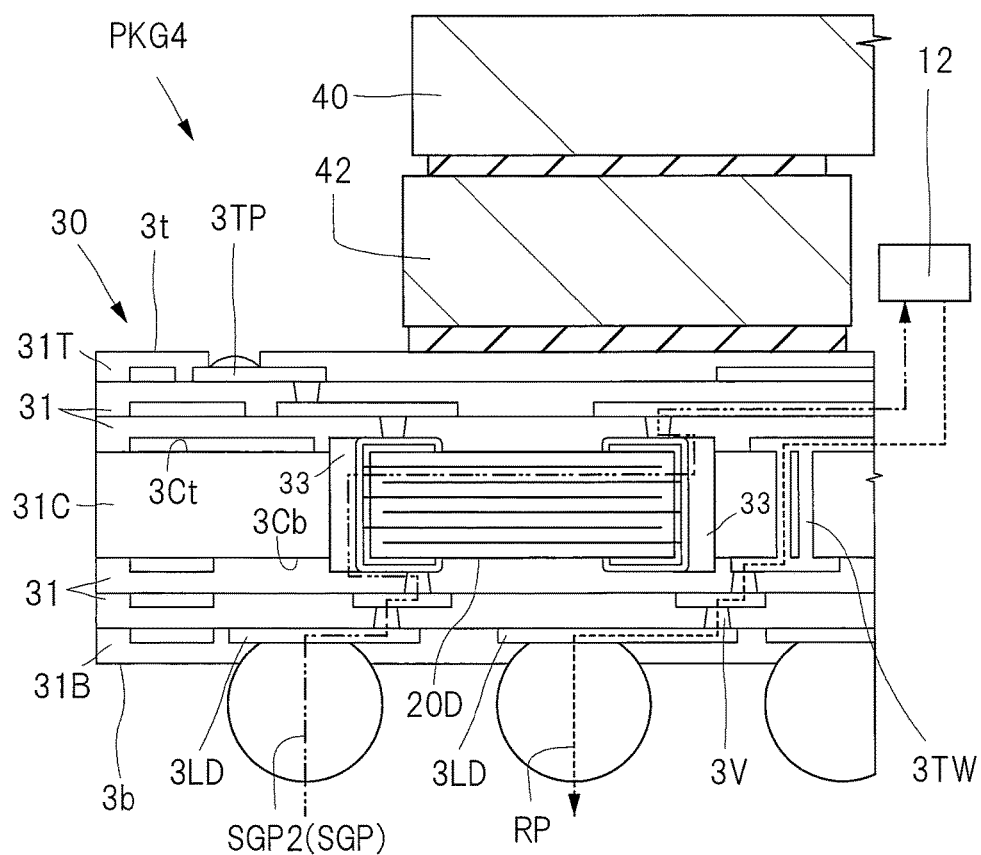
FIG. 12 is an enlarged plan view of the semiconductor device illustrated in FIG. 11.

Next, effects obtained by incorporating, in the wiring substrate 30, each of the plurality of DC cut-off capacitors 20D among the plurality of capacitors 20P and 20D illustrated in FIG. 5 will be described. FIG. 10 is an enlarged cross-sectional view schematically illustrating an exemplary signal transmission path connected to the DC cut-off capacitor illustrated in FIG. 5. Also, FIG. 11 is an enlarged plan view enlarging a periphery of a region where a DC cut-off capacitor of a semiconductor device according to a modification to FIG. 5 is incorporated. Also, FIG. 12 is an enlarged plan view of the semiconductor device illustrated in FIG. 11.

Figure 13:
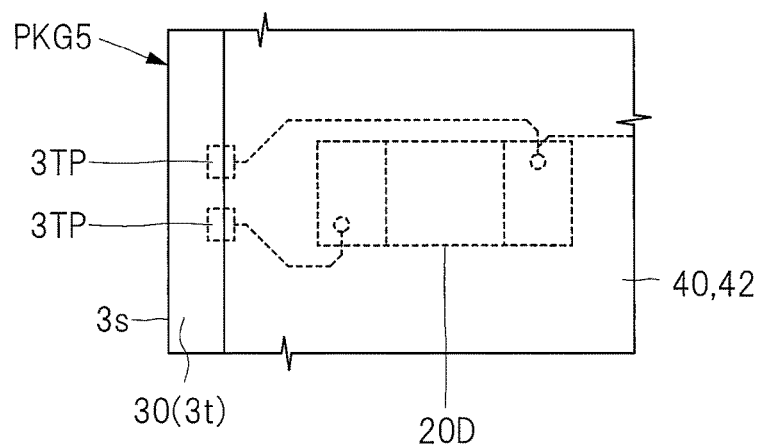
FIG. 13 is an enlarged plan view enlarging a periphery of a region where a DC cut-off capacitor of a semiconductor device as another modification to FIG. 5 is incorporated.
Figure 14:
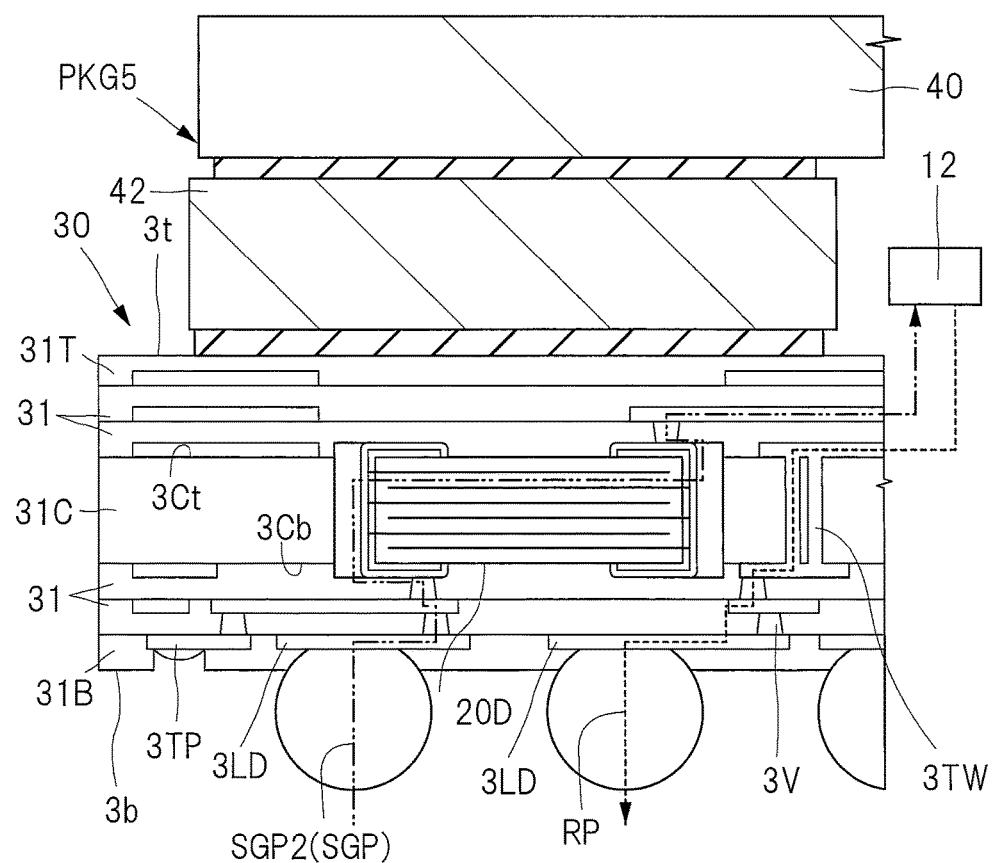
FIG. 14 is an enlarged plan view of the semiconductor device illustrated in FIG. 13.

Also, FIG. 13 is an enlarged plan view enlarging a periphery of a region where a DC cut-off capacitor of a semiconductor device as another modification to FIG. 5 is incorporated. Also, FIG. 14 is an enlarged plan view of the semiconductor device illustrated in FIG. 13. Also, FIG. 33 is an enlarged cross-sectional view schematically illustrating an exemplary signal transmission path connected to the DC cut-off capacitor illustrated in FIG. 32.

Note that, in each of FIG. 10, FIG. 12, FIG. 14, and FIG. 33, in order to clearly illustrate a signal transmission path and a return path passing through the capacitor 20D, the high speed transmission path SGP2 is schematically indicated by a two-dot chain line, and a return path RP is schematically indicated by a dotted line. Moreover, in FIG. 11 and FIG. 13, an exemplary wiring path connecting the capacitor 20D to a test terminal 3TP is indicated by a dotted line. Also, although FIG. 10, FIG. 12, FIG. 14, and FIG. 33 are cross-sectional views, hatching is omitted except for components mounted on the wiring substrate for viewability of the signal transmission path.

As illustrated in FIG. 10, the capacitor 20D included in the semiconductor device PKG2 of the present embodiment is incorporated in the wiring substrate 30. In contrast, the capacitor 20D included in the semiconductor device PKGh1 illustrated in FIG. 33 is not incorporated in the wiring substrate 30 but mounted on the upper surface 3t of the wiring substrate 30. As can be seen by comparing the semiconductor device PKG2 illustrated in FIG. 10 with the semiconductor device PKGh1 illustrated in FIG. 33, in a case where the capacitor 20D is incorporated in the wiring substrate 30, the high speed transmission path SGP2 and the return path RP change greatly in comparison with the case where the capacitor 20D is mounted on the wiring substrate 30. First, the high speed transmission path SGP2 of the semiconductor device PKG2 has fewer impedance discontinuity points than the high speed transmission path SGP2 of the semiconductor device PKGh1. The impedance discontinuity point is a location where an impedance value abruptly changes at a portion of the wiring path. For example, a wiring structure changes at a portion of the interlayer conductive path such as the via wiring 3V and the through-hole wiring 3TW, and thus, this portion is likely to be an impedance discontinuity point.

In the case of the semiconductor device PKG2, the number of the via wirings 3V and the number of through-hole wirings 3TW included in the high speed transmission path SGP2 are smaller than in the case of the semiconductor device PKGh1 illustrated in FIG. 33. With this configuration, it is possible to reduce the impedance discontinuity points included in the high speed transmission path SGP2 to enhance the transmission characteristics.

Also, in the example illustrated in FIG. 10, the capacitor 20D is arranged between the upper surface 3Ct and the lower surface 3Cb of the insulating layer 31C serving in the core material. Therefore, the high speed transmission path SGP2 connected to the capacitor 20D is electrically isolated from the through-hole wiring 3TW. In other words, the high speed transmission path SGP2 connected to the capacitor 20D is electrically connected with the semiconductor chip 12 without passing through the through-hole wiring 3TW. The value of the impedance tends to change greatly in the portion of the through-hole wiring 3TW and the capacitor 20D among the above-described impedance discontinuity points, leading to a greater influence on particularly the transmission characteristics compared to the via wiring 3V. For this reason, as illustrated in FIG. 10, by embedding the capacitor 20D in the insulating layer 31C provided with the through-hole wiring 3TW, it is possible to omit one through-hole wiring 3TW, so that particularly the transmission characteristics of the high speed transmission path SGP2 can be enhanced.

Meanwhile, an electrical test of a circuit formed in the semiconductor device PKG2 includes a DC test of applying a DC current to the circuit for inspection, in some cases. The DC test includes, for example, a continuity test for checking the electrical connection state of a circuit.

Here, in order to allow a DC current to flow in a case where the DC cut-off capacitor 20D is inserted in series connection into the circuit subjected to the DC test, there is a need to short-circuit one electrode 2E1 (see FIG. 7) and the other electrode 2E2 of the capacitor 20D to provide a path allowing a DC current to flow.

In a case, however, where the DC cut-off capacitor 20D is incorporated in the wiring substrate 30 as in the present embodiment, the electrode 2E1 (see FIG. 7) and the electrode 2E2 (see FIG. 7) of the capacitor 20D might be embedded between the upper surface 3t and the lower surface 3b of the wiring substrate 30 without being exposed, in some cases. In a case where the electrode 2E1 and the electrode 2E2 of the capacitor 20D are not exposed to the outside of the wiring substrate 30, another method for bypassing between the electrodes of the capacitor 20D would be needed in order to perform the DC test. For this purpose, in the present embodiment, the test terminal 3TP connected with one electrode 2E1 of the capacitor 20D and the test terminal 3TP connected with the other electrode 2E2 are provided at positions where they can be exposed from the wiring substrate 30. With this configuration, it is possible to apply a DC current to the high speed transmission path SGP2 by electrically connecting the two terminals 3TP in performing the DC test.

Specifically, as illustrated in FIG. 6, the wiring substrate 30 of the present embodiment includes the terminals (chip connection terminals) 3BF arranged on the upper surface 3t side and electrically connected with the plurality of pads 1PD of the semiconductor chip 12, and the lands 3LD serving as a plurality of external terminals arranged on the lower surface 3b side. In addition, the wiring substrate 30 includes test terminals 3TP1 and 3TP2 connected with the capacitor 20D and exposed from the wiring substrate 30. Also, as illustrated in FIG. 10, one electrode 2E1 of the capacitor 20D is connected with the chip connection terminal 3BF (see FIG. 6) and one test terminal 3TP1. In addition, the other electrode 2E2 of the capacitor 20D is connected with the land 3LD serving as an external terminal and the other test terminal 3TP2.

By allowing the terminal 3TP1 connected with the electrode 2E1 of the capacitor 20D and the terminal 3TP2 connected with the electrode 2E2 to be exposed from the wiring substrate 30, it is possible to easily short-circuit the terminal 3TP1 and the terminal 3TP2. Note that, in the example illustrated in FIG. 10, each of the plurality of test terminals 3TP is exposed from the uppermost insulating layer 31T in the upper surface 3t of the wiring substrate 30. Alternatively, as a modification, the test terminal 3TP may be formed on the lower surface 3b side and exposed from the lowermost insulating layer 31B in the lower surface 3b of the wiring substrate 30.

Also, as described above, in the present application, the state "the capacitor 20D is incorporated in the wiring substrate 30" includes the following cases. That is, it is a case where the electrodes 2E1 and 2E2 of the capacitor 20D are exposed at least in one of the upper surface 3t and the lower surface 3b of the wiring substrate 30, and the portion (main portion) other than the exposed electrode is arranged between the upper surface 3t and the lower surface 3b. In this case, a portion of each of the electrode 2E1 and the electrode 2E2 of the capacitor 20D exposed from the wiring substrate 30 may be used in place of the above-described test terminal 3TP. That is, in performing the DC test, a portion of each of the electrode 2E1 and the electrode 2E2 of the capacitor 20D exposed from the wiring substrate 30 may be short-circuited.

Also, as illustrated in FIG. 10, in the case of providing a wiring path which electrically connects each of the electrodes 2E1 and 2E2 of the capacitor 20D with the test terminal 3TP, the following configuration is preferable from the viewpoint of reducing an influence of the wiring path connected with the terminal 3TP on a signal waveform and a waveform quality of a signal transmission path. Specifically, in the present embodiment, each of a wiring path distance from the electrode 2E1 of the capacitor 20D to the terminal 3TP1 of the wiring substrate 30 and a wiring path distance from the electrode 2E2 of the capacitor 20D to the terminal 3TP2 of the wiring substrate 30 may preferably be equal to or smaller than one-quarter of a wavelength of an electric signal supplied to the capacitor 20D. This makes it possible to suppress a decrease in signal strength due to the influence of the test wiring path.

Moreover, from the viewpoint of shortening the test wiring path connected to the capacitor 20D, it is preferable to arrange, in plan view, each of the plurality of test terminals 3TP at a position overlapping with the capacitor 20D as illustrated in FIG. 5.

Alternatively, as long as it is within a range to enable shortening of the test wiring path, each of the plurality of test terminals 3TP may be arranged at a position not overlapping with the capacitor 20D. For example, there is a case, as in a semiconductor device PKG4 illustrated in FIG. 11 and FIG. 12 which is a modification to FIG. 5 and FIG. 6, where the capacitor 20D is arranged at a position overlapping with the heat dissipation plate 40 or the support frame 42 supporting the heat dissipation plate 40. In this case, in order to perform the DC test with the heat dissipation plate 40 attached, each of the plurality of test terminals 3TP may preferably be arranged between the heat dissipation plate 40 and the peripheral edge of the wiring substrate 30 in plan view. In the example illustrated in FIG. 11 and FIG. 12, the test terminals 3TP are arranged between the capacitor 20D and the peripheral edge of the wiring substrate 30.

Moreover, for example, in a case where a portion to the vicinity of the peripheral edge of the upper surface 3t of the wiring substrate 30 is covered with the heat dissipation plate 40 as in a semiconductor device PKG5 illustrated in FIG. 13 and FIG. 14 as another modification to FIG. 5 and FIG. 6, it is difficult to arrange the test terminal 3TP on the upper surface 3t side. Even in this case, it is possible to perform the DC test with the heat dissipation plate 40 attached in a case where each of the plurality of test terminals 3TP is formed on the lower surface 3b (see FIG. 10) side of the wiring substrate 30.

Each of the plurality of effects described in the present section can be obtained regardless of presence or absence of the plurality of capacitors 20P illustrated in FIG. 5. Therefore, even in the case of a semiconductor device (not illustrated) without the plurality of capacitors 20P illustrated in FIG. 5, the effects described in the present section can be obtained in a case where each of the plurality of capacitors 20D is incorporated in the wiring substrate 30.

<Capacitor Layout 3>

Figure 15:
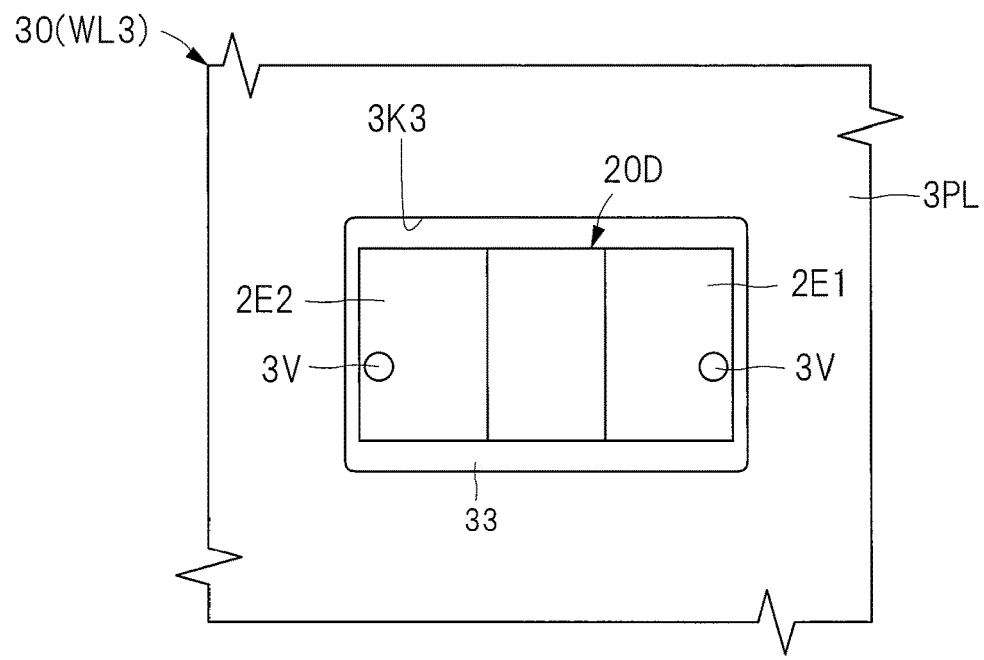
FIG. 15 is an enlarged plan view of a wiring layer in which a capacitor is embedded, among the plurality of wiring layers illustrated in FIG. 10.
Figure 16:
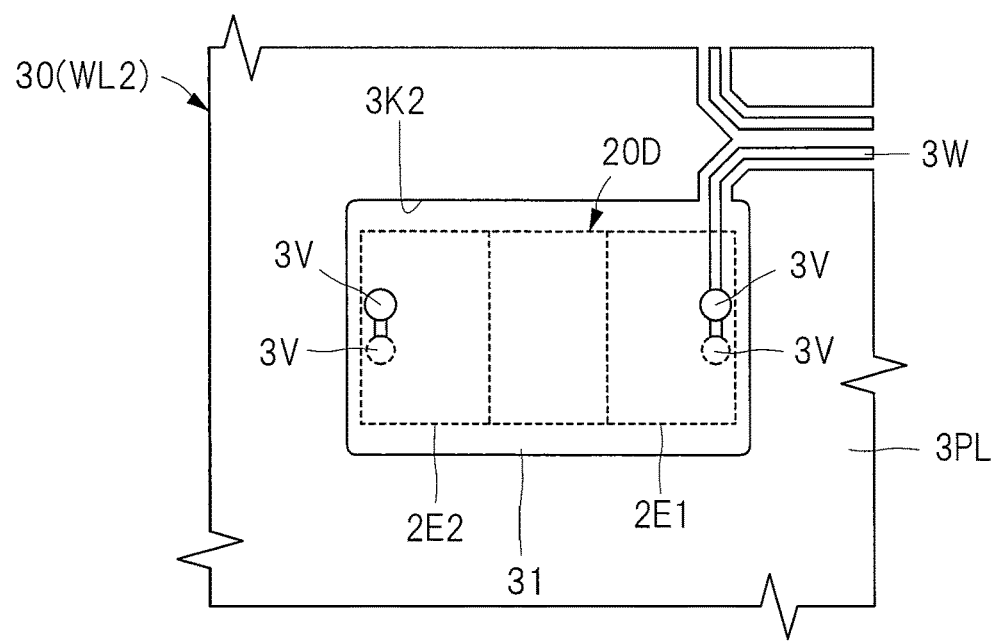
FIG. 16 is an enlarged plan view of a wiring layer immediately higher than the wiring layer illustrated in FIG. 15.
Figure 17:
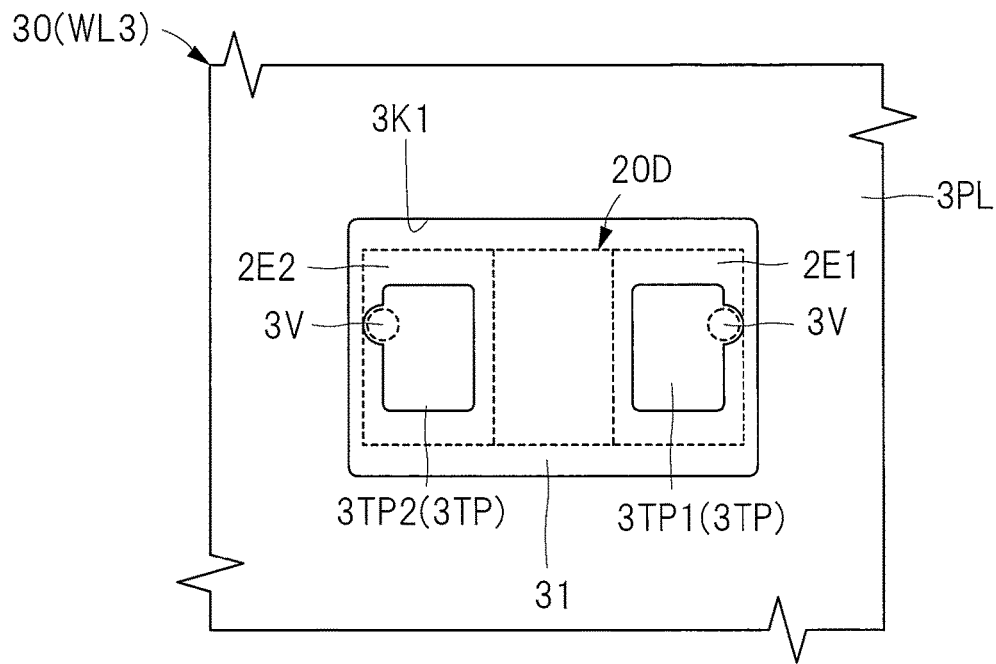
FIG. 17 is an enlarged plan view of a wiring layer immediately higher than the wiring layer illustrated in FIG. 16.

Next, layout of the conductor pattern around the capacitor will be described. FIG. 15 is an enlarged plan view of a wiring layer in which a capacitor is embedded, among the plurality of wiring layers illustrated in FIG. 10. Also, FIG. 16 is an enlarged plan view of a wiring layer immediately higher than the wiring layer illustrated in FIG. 15. Also, FIG. 17 is an enlarged plan view of a wiring layer immediately higher than the wiring layer illustrated in FIG. 16.

As described above, from the viewpoint of suppressing the spread of the electric field and the magnetic field spreading from the signal transmission path to the surroundings at the time of signal transmission so as to suppress the crosstalk noise from other signals, the present embodiment is configured to arrange the conductor plane 3PL in a region where the wiring 3W or the like is not formed. As illustrated in FIG. 15 to FIG. 17, the conductor plane 3PL is formed in each of the wiring layers WL1 (see FIG. 17) to the wiring layer WL3 (see FIG. 17). Also, as illustrated in FIG. 15, in the wiring layer WL3, an opening 3K3 is formed at a part of the conductor plane 3PL, and a capacitor 20D is embedded inside the opening 3K3.

According to the examination by the inventors of the present application, however, it became clear that there is concern that the transmission characteristics of the high speed transmission path would be degraded in a case where, in the wiring layer WL2 illustrated in FIG. 16, for example, the conductor plane 3PL is arranged at a position overlapping with the electrode 2E1 and the electrode 2E2 of the capacitor 20D to allow most of the capacitor 20D to be covered with the conductor plane 3PL. That is, it became clear that capacitive coupling would occur between the conductor plane 3PL and each of the electrodes 2E1 and 2E2 to add a parasitic capacitance to the transmission path.

Considering a degree of freedom of connection position of the electrode 2E1 and the electrode 2E2 of the capacitor 20D, among the conductor patterns constituting the high speed transmission path, it is difficult to allow the electrode 2E1 and the electrode 2E2 of the capacitor 20D to have a wiring width (minimum width dimension) as in the routing wiring (wiring 3W illustrated in FIG. 16, for example). Herein, the "minimum width dimension" of the electrode 2E1 and the electrode 2E2 is the smallest length in the width direction DW illustrated in FIG. 7, for example.

In a case where capacitive coupling occurs between the conductor plane 3PL and each of the electrodes 2E1 and 2E2, the value of the parasitic capacitance increases in proportion to an area of the portion overlapping mainly in the thickness direction. When a parasitic capacitance is added to the electrode 2E1 and the electrode 2E2 included in the high speed transmission path, the impedance in the high speed transmission path apparently decreases. That is, adding a section with low impedance to a part of the high speed transmission path causes impedance discontinuity. In the signal transmission path of a high frequency signal, by designing a wiring layout to allow the impedance component in the transmission path so as to be close to a predetermined value (for example, 50 ohms for a single line, 100 ohms for a differential, or 85 ohms for a differential), it is possible to suppress deterioration of characteristics such as signal reflection. Therefore, from the viewpoint of enhancing the signal transmission quality, it is preferable that the value of the parasitic capacitance generated between the electrode 2E1 or the electrode 2E2 and the conductor plane 3PL is reduced as much as possible to achieve impedance matching.

Therefore, the inventors of the present application have found a method of suppressing occurrence of impedance discontinuity in the electrode 2E1 and the electrode 2E2 for mounting the capacitor 20D in a case where the capacitor 20D is mounted in the semiconductor device. That is, as illustrated in FIG. 16, the conductor plane 3PL of the wiring layer WL2 adjacent to the wiring layer WL3 including the electrodes 2E1 and 2E2 of the capacitor 20D has an opening 3K2 formed in a region overlapping with each of the electrode 2E1 and the electrode 2E2.

A relation between the electrodes 2E1 and 2E2 and the conductor plane 3PL illustrated in FIG. 16 can also be expressed as follows. That is, the conductor plane 3PL of the wiring layer WL2 is opened in a region overlapping with each of the electrode 2E1 and the electrode 2E2.

Also, in the opening 3K2, the insulating layer 31 covering the wiring layer WL3 (see FIG. 15) provided on the further inner side by one layer from the wiring layer WL2 is exposed in a region where the wiring 3W and the via wiring 3V are not formed.

Also, as described above, the value of the parasitic capacitance caused by the capacitive coupling increases in proportion to the area of the portion where the conductor plane 3PL and the electrode 2E1 or the electrode 2E2 overlap with each other in the thickness direction. Therefore, as illustrated in FIG. 16, it is particularly preferable that the whole of the electrode 2E1 and the electrode 2E2 do not overlap with the conductor plane 3PL in the thickness direction. In other words, as illustrated in FIG. 16, the outline of the electrode 2E1 and the outline of the electrode 2E2 are preferably located inside an opening end portion (a peripheral portion of the region with the opening) of the opening 3K2 in plan view.

The value of the parasitic capacitance can be reduced, however, even when a part of each of the electrode 2E1 and the electrode 2E2 overlaps with the conductor plane 3PL in the thickness direction. For example, provided that 90% or more of a planar area of the electrode 2E1 and the electrode 2E2 does not overlap with the conductor plane 3PL, the value of the parasitic capacitance can be reduced.

In addition, a shape of the opening 3K2 illustrated in FIG. 16 preferably corresponds to a shape and a position of the electrode 2E1 and the electrode 2E2 in the wiring layer WL3 (see FIG. 15). As illustrated in FIG. 16, as long as the opening 3K2 is formed so as to include the entire region overlapping with the electrode 2E1 and the electrode 2E2, the value of the parasitic capacitance would not decrease greatly even when the area of the opening 3K2 increases.

Meanwhile, the conductor plane 3PL is used as a reference path (return path) of a high speed transmission path, in some cases. In this case, it is preferable to maintain a constant separation distance between the reference path and the high speed transmission path. Accordingly, it is preferable that the area of the opening 3K2 is not extremely large. For example, as illustrated in FIG. 16, the outline of the opening end portion of the opening 3K2 is formed preferably along the outlines of the electrode 2E1 and the electrode 2E2 in the wiring layer WL3 (see FIG. 15).

As described above, according to the present embodiment, the electrode 2E1 and the electrode 2E2 constituting a part of the high speed transmission path are formed in the wiring layer WL3. The conductor plane 3PL formed in the wiring layer WL2 adjacent to the wiring layer WL3 in the thickness direction is opened in the region overlapping with each of the electrode 2E1 and the electrode 2E2. With this configuration, it is possible to suppress decrease in impedance due to the capacitive coupling between the conductor plane 3PL and each of the electrode 2E1 and the electrode 2E2, leading to enhancement of the noise resistance of the high speed transmission path. The semiconductor device PKG2 (see FIG. 5) of the present embodiment can enhance the noise resistance of the high speed transmission path, leading to enhancement of the electrical characteristics and reliability.

Moreover, as illustrated in FIG. 17, in the present embodiment, the conductor plane 3PL of the wiring layer WL1 stacked immediately over the wiring layer WL2 (see FIG. 16) includes an opening 3K1 formed in a region overlapping with each of the electrode 2E1 and the electrode 2E2. Inside the opening 3K1, the test terminals 3TP1 and 3TP2 are arranged.

A relation between the electrodes 2E1 and 2E2 and the conductor plane 3PL illustrated in FIG. 17 can also be expressed as follows. That is, the conductor plane 3PL of the wiring layer WL1 is opened in the region overlapping with each of the electrode 2E1 and the electrode 2E2.

Considering the parasitic capacitance added to the electrode 2E1 and the electrode 2E2, there is a need to consider the capacitive coupling between the electrode 2E1 or 2E2 and the conductor plane 3PL of the wiring layer WL2 closest to the wiring layer WL3. Therefore, as described above, by forming the opening 3K2 described above in the conductor plane 3PL of the wiring layer WL2, the value of the parasitic capacitance can be greatly reduced. Accordingly, by providing the opening 3K2 illustrated in FIG. 16 irrespective of the wiring structure of the wiring layer WL1, it is possible to enhance the noise resistance of the high speed transmission path.

In addition to the above, however, in order to further enhance the noise resistance of the high speed transmission path, it is preferable to consider the capacitive coupling with the conductor plane 3PL formed in the wiring layer WL1 having a smaller separation distance to the wiring layer WL3, next to the wiring layer WL2. In particular, the thickness of each of wiring layers tends to be reduced in order to cope with both thinning of the semiconductor package and the increased number of wiring layers accompanying higher functionality of the semiconductor device. In a case where capacitive coupling occurs between the conductor plane 3PL and the electrodes 2E1 and 2E2, the value of the parasitic capacitance increases in inverse proportion to the separation distance of the portion overlapping mainly in the thickness direction. Therefore, with the reduced thickness of each of the plurality of wiring layers, the value of the parasitic capacitance tends to be larger. Note that, in the present embodiment, for example, a thickness of the insulating layer 31 (see FIG. 6) covering the wiring layers WL2 and WL3 is 20 μm to 30 μm.

Therefore, in the present embodiment, the opening 3K1 is formed in a region overlapping with the electrode 2E1 and the electrode 2E2 in the conductor plane 3PL formed in the wiring layer WL1. A preferable shape of the opening 3K1 and an overlapping degree with the electrode 2E1 and the electrode 2E2 are similar to those in the case of the opening 3K2 illustrated in FIG. 6 described above, and thus, duplicate descriptions are omitted.

Moreover, each of the plurality of effects described in the present section can be obtained regardless of presence or absence of the plurality of capacitors 20P illustrated in FIG. 5. Therefore, even in the case of a semiconductor device (not illustrated) without the plurality of capacitors 20P illustrated in FIG. 5, the effects described in the present section can be obtained in a case where each of the plurality of capacitors 20D is incorporated in the wiring substrate 30.

<Capacitor Layout 4>

Figure 18:
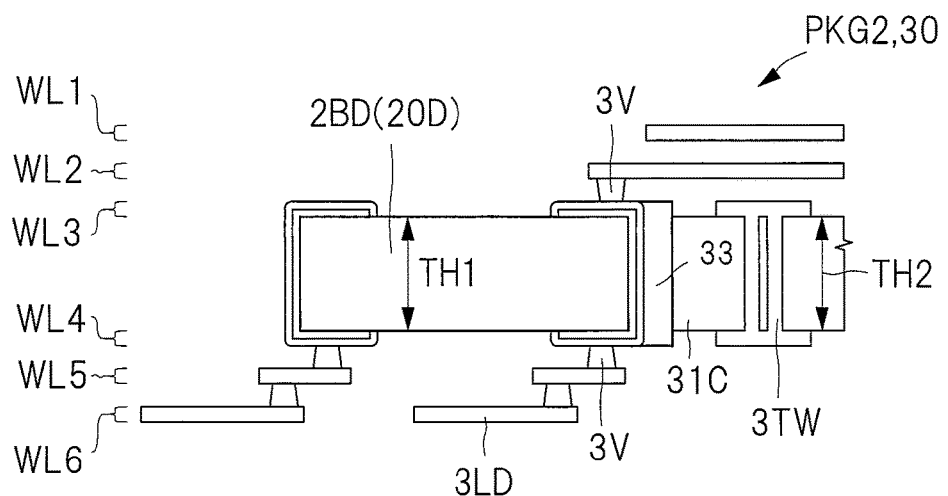
FIG. 18 is a cross-sectional view of a main portion illustrating a relation between the capacitor constituting a high speed transmission path illustrated in FIG. 10 and a core insulating layer in which a through-hole wiring is formed.
Figure 19:
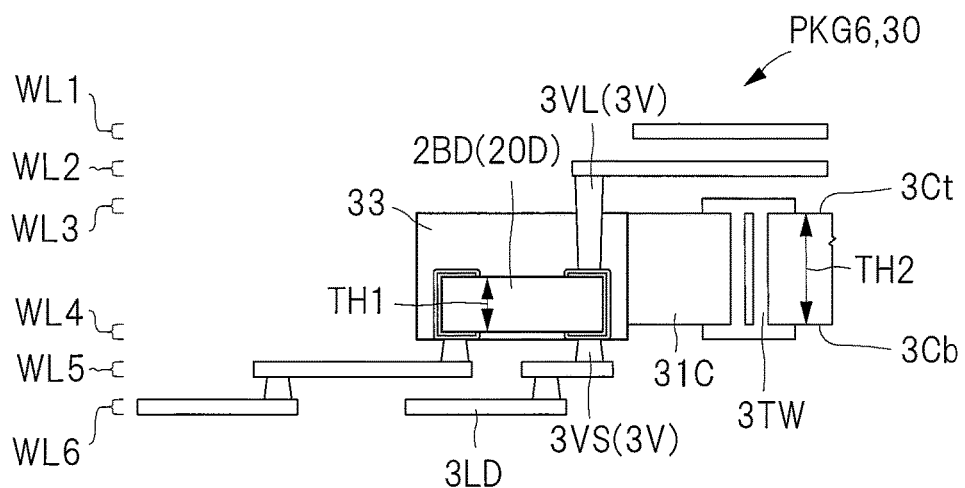
FIG. 19 is a cross-sectional view of a main portion illustrating a relation between a capacitor of a semiconductor device according to a modification to FIG. 18 and a core insulating layer in which a through-hole wiring is formed.
Figure 20:
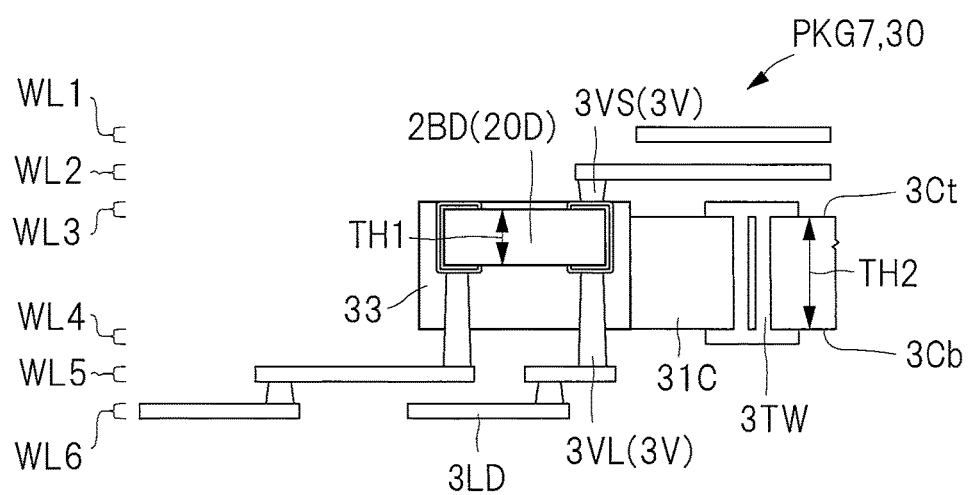
FIG. 20 is a cross-sectional view of a main portion illustrating a relation between a capacitor of a semiconductor device as another modification to FIG. 18 and a core insulating layer in which a through-hole wiring is formed.

Next, a relation between thicknesses of the capacitors 20D and 20P incorporated in the wiring substrate 30 and layout in the thickness direction of the wiring substrate 30 will be described. FIG. 18 is a cross-sectional view of a main portion illustrating a relation between the capacitor constituting the high speed transmission path illustrated in FIG. 10 and the core insulating layer in which the through-hole wiring is formed. Also, FIG. 19 is a cross-sectional view of a main portion illustrating a relation between a capacitor of a semiconductor device according to a modification to FIG. 18 and a core insulating layer in which a through-hole wiring is formed, and FIG. 20 is a cross-sectional view of a main portion illustrating a relation between a capacitor of a semiconductor device as another modification to FIG. 18 and a core insulating layer in which a through-hole wiring is formed.

As described above, one of advantages of incorporating the capacitor 20D illustrated in FIG. 10 in the wiring substrate 30 is that the number of impedance discontinuity points can be reduced by reducing the number of through-hole wirings 3TW included in the high speed transmission path. In order to achieve this advantage, it is preferable that the capacitor 20D is arranged (embedded) in the insulating layer 31C in which the through-hole wiring 3TW is formed.

Considering connectivity (joining easiness) of the via wiring 3V which electrically connects between the capacitor 20D arranged in the insulating layer 31C and other wiring layers, a thickness TH1 of the capacitor 20D is preferably equal to a thickness TH2 of the insulating layer 31C as illustrated in FIG. 18. In the example illustrated in FIG. 18, the thickness TH1 of the main body 2BD is the same in value as the thickness of the insulating layer 31C (distance from one of the upper surface 3Ct and the lower surface 3Cb toward the other, illustrated in FIG. 10). When the thickness TH1 of the capacitor 20D and the thickness TH2 are substantially of the same level, the via wiring 3V of the same size as the via wiring 3V connected to the through-hole wiring 3TW can be connected to the electrodes 2E1 and 2E2 (see FIG. 10) of the capacitor 20D. In this case, since a plurality of the via wirings 3V can be formed at a time, efficiency of the forming process of the via wiring 3V can be enhanced.

Also, from the viewpoint of easy inventory management of the capacitor 20D, it is preferable to use a general-purpose product as the capacitor 20D. In this case, the thickness TH1 of the capacitor 20D illustrated in FIG. 18 might differ depending on the product to be used. Meanwhile, the thickness TH2 of the insulating layer 31C illustrated in FIG. 18 is determined in accordance with specifications such as the supporting strength and electrical characteristics of the wiring substrate 30. Therefore, there may be a case where it is difficult to equalize the thickness TH1 of the capacitor 20D and the thickness TH2 of the insulating layer 31C.

For example, in the example of a semiconductor device PKG6 illustrated in FIG. 19 or a semiconductor device PKG7 illustrated in FIG. 20, the thickness TH1 of the capacitor 20D is smaller than the thickness TH2 of the insulating layer 31C. In the case of the semiconductor device PKG6 or the semiconductor device PKG7, a part of the capacitor 20D protrudes from one of the upper surface 3Ct and the lower surface 3Cb of the insulating layer 31C. In this case, a via wiring 3VL having a relatively greater thickness (in other words, greater length in the thickness direction) is connected to one surface of the electrode 2E1 (see to FIG. 10) of the capacitor 20D, and a via wiring 3VS having a relatively smaller thickness (in other words, smaller length in the thickness direction) is connected to an opposite surface of the electrode 2E1.

An insulating member (filler material) 33 formed of an insulating material such as resin is buried around the capacitor 20D. As illustrated in FIG. 6, the insulating member 33 is arranged around the capacitor 20D and the capacitor 20P even in the case of the semiconductor device PKG2. The insulating member 33 may be the same material as the insulating member buried in the through-hole wiring 3TW, or may be a different material. Moreover, a portion of the insulating member 33 illustrated in FIG. 6 may be formed integrally with the insulating layer 31 formed immediately over the insulating layer 31C and the insulating layer 31 formed immediately under the insulating layer 31C.

Alternatively, as a modification not illustrated, the capacitor 20D may be arranged at a position in the middle of the upper surface 3Ct and the lower surface 3Cb of the insulating layer 31C. In this case, however, the process of embedding the capacitor 20D in the wiring substrate 30 becomes complicated, and in this sense, the configuration of the semiconductor device PKG6 or the semiconductor device PKG7 is preferable in that the manufacturing process becomes simplified.

According to the modification illustrated in FIG. 19 and FIG. 20, since the thickness TH1 of the capacitor 20D and the thickness TH2 of the insulating layer 31C can be set to arbitrary values, a degree of freedom in selecting the capacitor 20D and a degree of freedom in selecting the thickness of the insulating layer 31C can be enhanced.

However, in the case of a via wiring having a great length in the thickness direction like the via wiring 3VL illustrated in FIG. 19 and FIG. 20, impedance becomes greater than that of the other via wiring 3V. Therefore, from the viewpoint of reducing the impedance discontinuity point in the high speed transmission path, the thickness TH1 of the capacitor 20D is preferably substantially the same as the thickness TH2 of the insulating layer 31C as illustrated in FIG. 18.

Note that, in the present section, the DC cut-off capacitor 20D has been described by way of example; however, it is applicable to use a capacitor having a thickness different from the thickness of the insulating layer 31C as illustrated in FIG. 19 and FIG. 20 as the power supply capacitor 20P illustrated in FIG. 6.

<Method of Connecting Capacitor and Via Wiring>

In a case where the capacitor 20D and the capacitor 20P are incorporated in the wiring substrate 30 (see FIG. 6) as in the present embodiment, there is a need to connect the via wiring 3V to the electrode 2E (see FIG. 21) of each of the capacitor 20D and the capacitor 20P. An exemplary method of connecting the capacitors 20D and 20P to the via wiring 3V will be sequentially described below with reference to FIG. 21 to FIG. 24. Each of FIG. 21 to FIG. 24 is a cross-sectional view of a main portion illustrating an exemplary implementation mode of connecting a via wiring to a capacitor incorporated in a wiring substrate.

In the examples illustrated in FIG. 21 to FIG. 24, the electrode 2E provided in each of the capacitors 20D and 20P includes an upper surface 2Et and a lower surface 2Eb opposite to the upper surface 2Et. Also, in the examples illustrated in FIG. 21 to FIG. 24, the via wiring 3V is connected to each of the upper surface 2Et and the lower surface 2Eb of the electrode 2E included in each of the capacitors 20D and 20P. Moreover, in the examples illustrated in FIG. 21 to FIG. 24, the upper surface 2Et of the electrode 2E provided in the wiring layer WL3 is electrically connected with the wiring layer WL2 via a via wiring 3V23. Moreover, the wiring layer WL1 and the wiring layer WL2 are electrically connected with each other via a via wiring 3V12. In addition, the lower surface 2Eb of the electrode 2E provided in the wiring layer WL4 is electrically connected with the wiring layer WL5 via a via wiring 3V45. Moreover, the wiring layer WL5 is electrically connected with the wiring layer WL6 via a via wiring 3V56.

Figure 21:
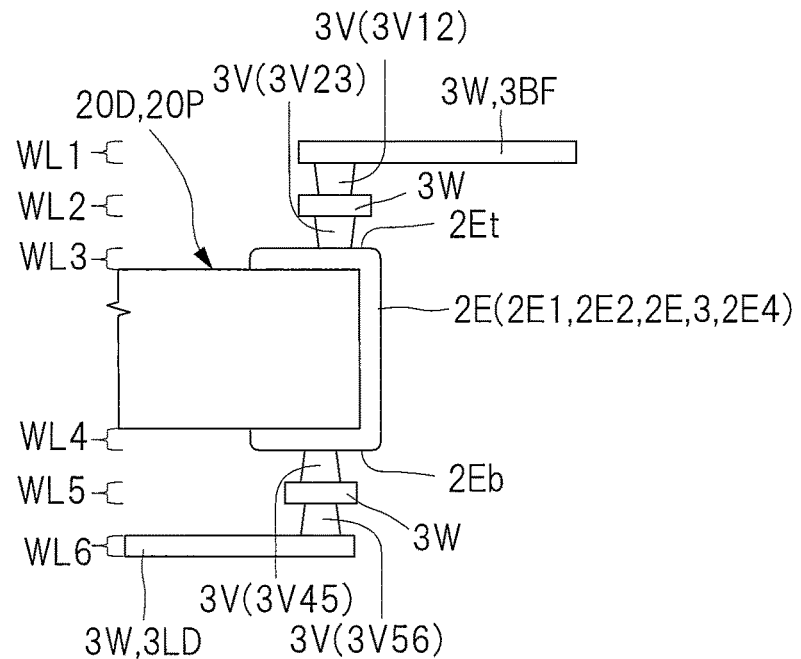
FIG. 21 is a cross-sectional view of a main portion illustrating an exemplary implementation mode of connecting a via wiring to a capacitor incorporated in a wiring substrate.

First, in the example illustrated in FIG. 21, the via wiring 3V23 and the via wiring 3V12 overlap with each other in the thickness direction (in other words, they mutually overlap in plan view). Moreover, in the example illustrated in FIG. 21, the via wiring 3V45 and the via wiring 3V56 overlap with each other in the thickness direction (in other words, they mutually overlap in plan view). In this manner, in a case where the via wirings 3V arranged adjacent to each other in the thickness direction are arranged so as to overlap in the thickness direction, it is possible to reduce a routing space of the wiring path. Accordingly, higher density of the wiring path can be achieved. A wiring method illustrated in FIG. 21 is effective when applied to a region having a large number of wiring paths and needing high wiring density. For example, in a region overlapping with the semiconductor chip 12 (see FIG. 6), the signal transmission paths and the supply paths for power supply potential and reference potential are arranged at high density. Therefore, the wiring density can be enhanced by applying a connection structure of the via wiring illustrated in FIG. 21 to the capacitor connected to the region overlapping with the semiconductor chip 12.

Figure 22:
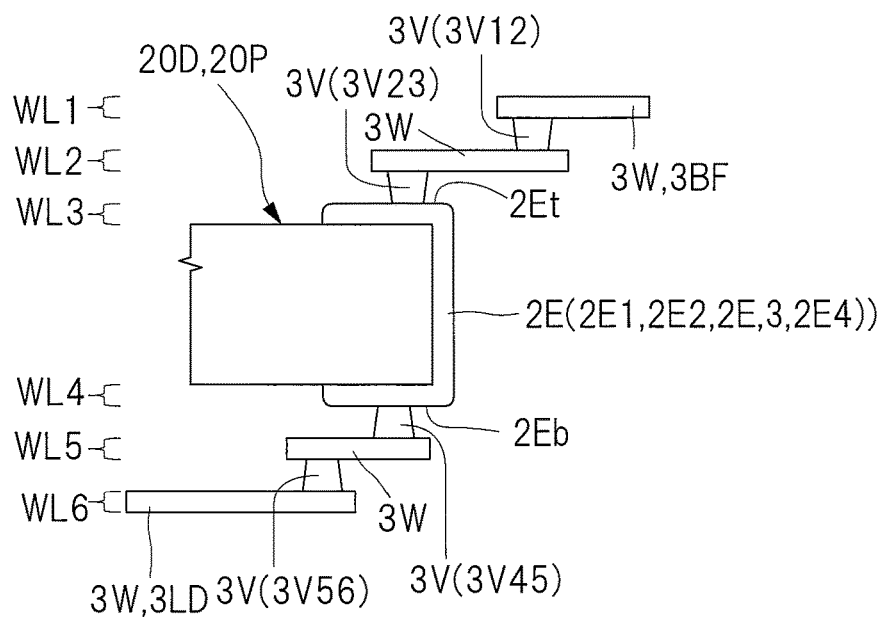
FIG. 22 is a cross-sectional view of a main portion illustrating another exemplary implementation mode of connecting a via wiring to a capacitor incorporated in a wiring substrate, differently from FIG. 21.

In contrast, in the example illustrated in FIG. 22, the via wiring 3V23 and the via wiring 3V12 do not overlap with each other in the thickness direction (in other words, they do not overlap in plan view). Moreover, in the example illustrated in FIG. 21, the via wiring 3V45 and the via wiring 3V56 do not overlap with each other in the thickness direction (in other words, they do not overlap in plan view). In the case of the layout of the via wiring 3V illustrated in FIG. 22, since it is necessary to provide a leading wiring in each of the wiring layers, the wiring density decreases as compared with the example illustrated in FIG. 21. In addition, the wiring path distance of each of the wiring paths is longer than the example illustrated in FIG. 21. In contrast, however, in a case where the via wirings 3V do not overlap with each other in the thickness direction as in the example illustrated in FIG. 22, it is possible to perform a process of connecting the via wiring 3V to the conductor pattern such as the wiring 3W more easily as compared with the example illustrated in FIG. 21. With this configuration, it is possible to enhance connection reliability between the via wiring 3V and other conductor patterns. A connection method of the via wiring 3V illustrated in FIG. 22 is effective when applied to a wiring path needing high reliability, such as a signal transmission path.

Figure 23:
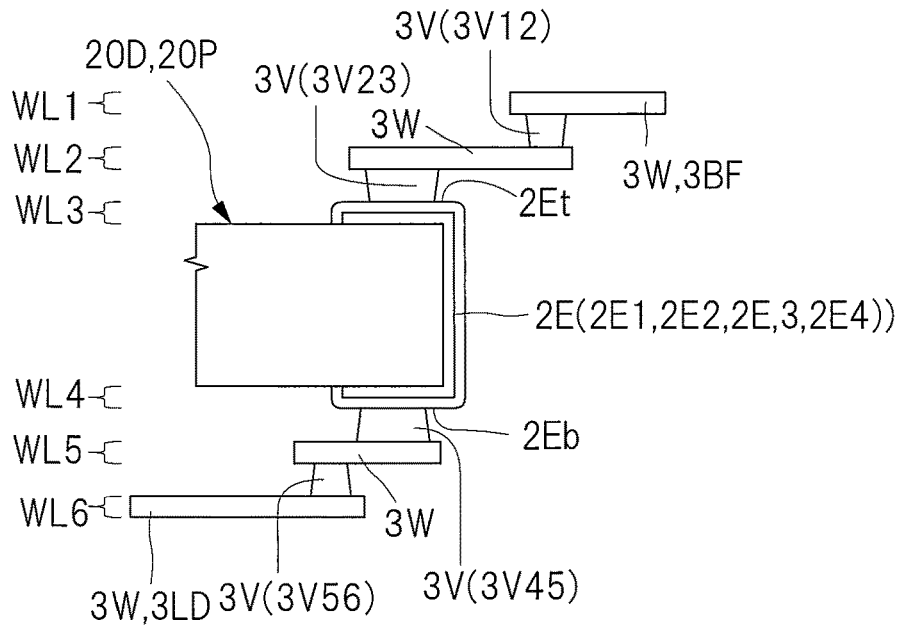
FIG. 23 is a cross-sectional view of a main portion illustrating still another exemplary implementation mode of connecting a via wiring to a capacitor incorporated in a wiring substrate, differently from FIG. 21 and FIG. 22.

Next, in the example illustrated in FIG. 23, a diameter of the via wiring 3V23 is larger than a diameter of the via wiring 3V12. Moreover, a diameter of the via wiring 3V45 is larger than a diameter of the via wiring 3V56. That is, in the example illustrated in FIG. 23, the diameter of each of the via wirings 3V23 and 3V45 connected to the electrodes 2E of the capacitors 20D and 20P is larger than the diameter of the via wiring 3V connected to a portion other than the electrodes 2E of the capacitors 20D and 20P. In a configuration in which the capacitors 20D and 20P are incorporated in the wiring substrate 30 (see FIG. 6), a stress may be applied to a connection portion between the electrode 2E and each of the via wirings 3V23 and 3V45 due to a difference in a linear expansion coefficient between the capacitor 20D or 20P and the insulating layer 31C (see FIG. 6), in some cases. Therefore, it is preferable to enhance a connection strength of the connection portion between the electrode 2E and each of the via wirings 3V23 and 3V45 as compared with other connection portions. In this respect, as illustrated in FIG. 23, with a configuration in which the via wirings 3V23 and 3V45 connected to the electrode 2E of the capacitor 20D or 20P have large diameters, it is possible to increase a connection area between the electrode 2E and each of the via wirings 3V23 and 3V45. As a result, the connection reliability of the connection portion between the electrode 2E and each of the via wirings 3V23 and 3V45 can be enhanced.

Figure 24:
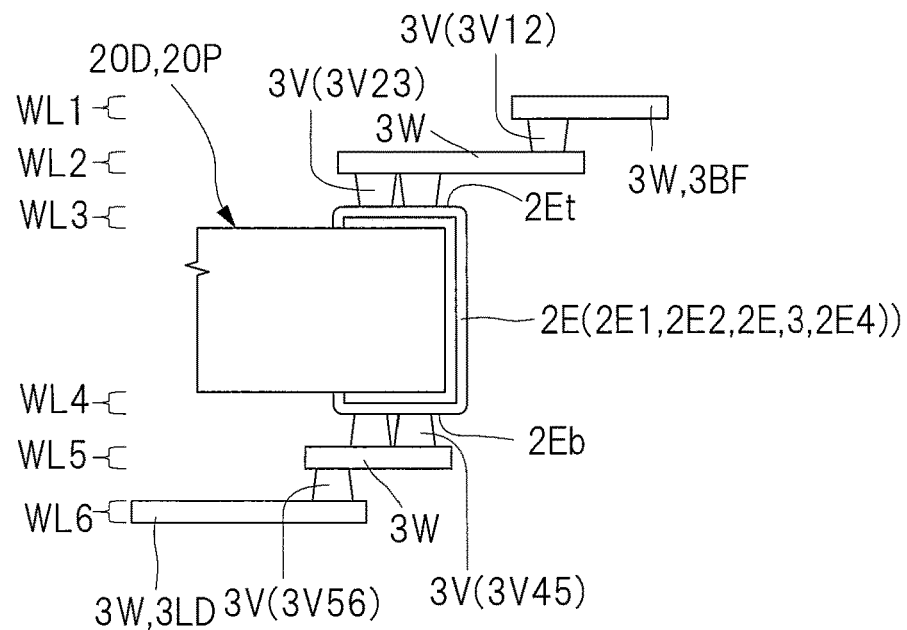
FIG. 24 is a cross-sectional view of a main portion illustrating yet another exemplary implementation mode of connecting a via wiring to a capacitor incorporated in a wiring substrate, differently from FIG. 21 to FIG. 23.

Moreover, in the example illustrated in FIG. 24, a plurality of the via wirings 3V23 are connected to the upper surface 2Et of the electrode 2E. In addition, a plurality of via wirings 3V45 are connected to the lower surface 2Eb of the electrode 2E. In other words, the plurality of via wirings 3V are connected to each of the upper surface 2Et and the lower surface 2Eb of the electrode 2E. In this example, it is possible to increase a total connection area of the electrode 2E and the plurality of via wirings 3V23 and 3V45. Therefore, also in the example illustrated in FIG. 24, the connection reliability of the connection portions between the electrode 2E and the plurality of via wirings 3V23 and 3V45 can be enhanced.

Note that, while the examples illustrated in FIG. 21 to FIG. 24 describe a case where the via wiring 3V connecting the adjacent wiring layers, there are other various modifications to the connection structure of the via wiring 3V other than the examples illustrated in FIG. 21 to FIG. 24.

For example, it is applicable to use a portion of the exemplary structure illustrated in FIG. 21 to FIG. 24 and a portion of another exemplary structure in combination. Moreover, for example, as a further modification to the exemplary structure illustrated in FIG. 21, it is applicable to electrically connect the wiring layer WL1 with the wiring layer WL3 using a via wiring 3V penetrating the wiring layer WL2, instead of the via wiring 3V12 and the via wiring 3V23 illustrated in FIG. 21.

<Method of Manufacturing Semiconductor Device>

Figure 25:
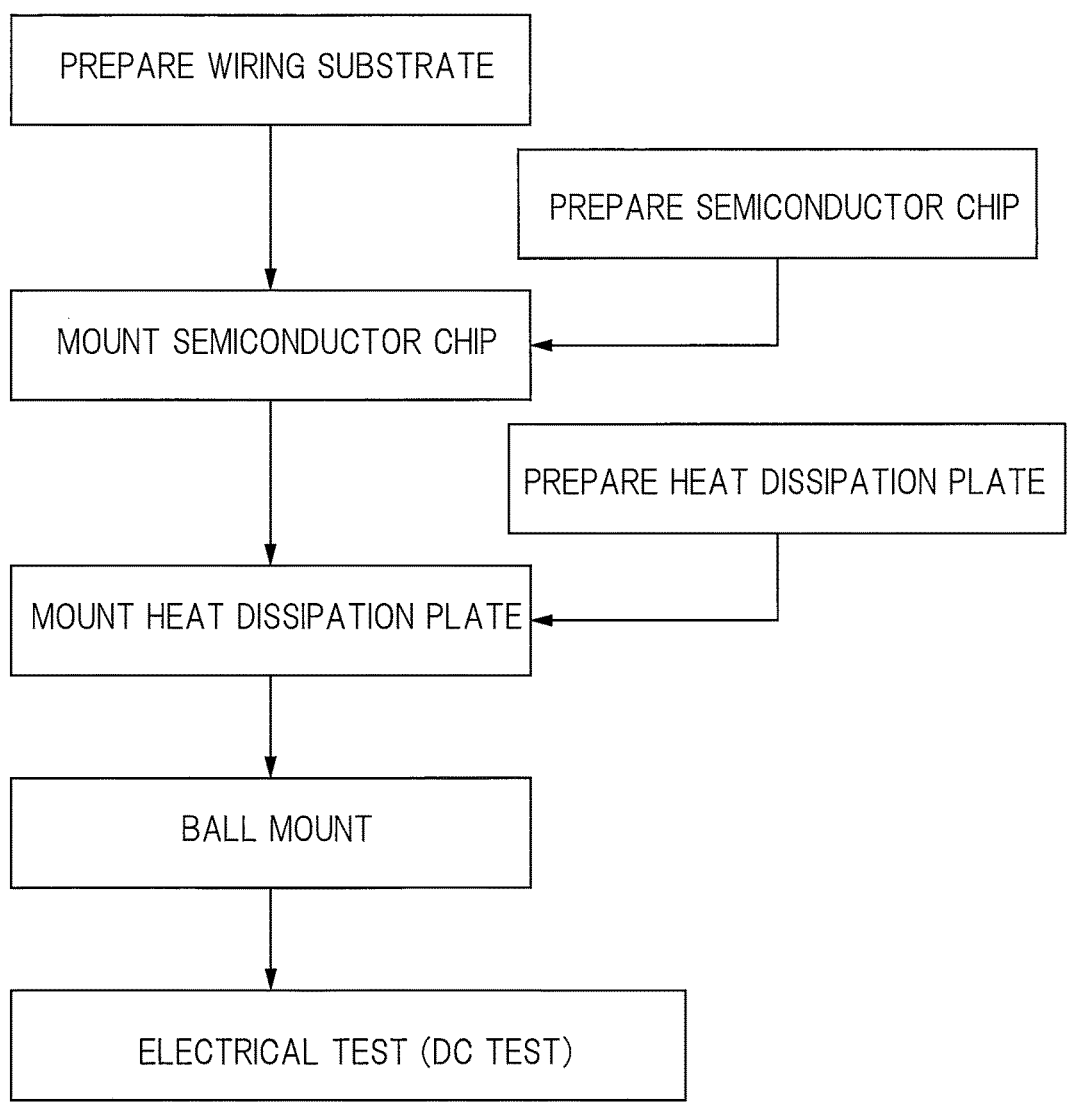
FIG. 25 is an explanatory diagram illustrating an outline of a manufacturing process of a semiconductor device according to one embodiment.

Next, manufacturing processes of the semiconductor devices PKG2, PKG3, PKG4, PKG5, PKG6, and PKG7 described with reference to FIG. 1 to FIG. 24 will be described. In the present section, a method of manufacturing the semiconductor device PKG2 will be described as a representative example. The semiconductor device PKG2 is manufactured in accordance with a flow illustrated in FIG. 25. FIG. 25 is an explanatory diagram illustrating an outline of the manufacturing process of the semiconductor device according to the embodiment. Details of each of the processes will be described below. In the following description of the manufacturing method, a method for preparing the wiring substrate 30 formed in a product size beforehand to manufacture the semiconductor device PKG2 by one layer will be described. Alternatively, it is possible to apply, as a modification, to a multi-piece producing method in which a so-called multi-piece substrate, which is divided into a plurality of product forming regions, is first prepared, assembled for each of the plurality of product forming regions, and is divided for the plurality of product forming regions to obtain a plurality of semiconductor devices. In this case, a singulation process of cutting and dividing the multi-piece substrate for the product formation regions is added to follow the ball mounting process illustrated in FIG. 25 or follow the electrical test process.

Moreover, the following description will be given by referring to FIG. 1 to FIG. 24 described above, as necessary.

1. Wiring Substrate Preparation Process

First, in the wiring substrate preparation process illustrated in FIG. 25, the wiring substrate 30 illustrated in FIG.

Figure 26:
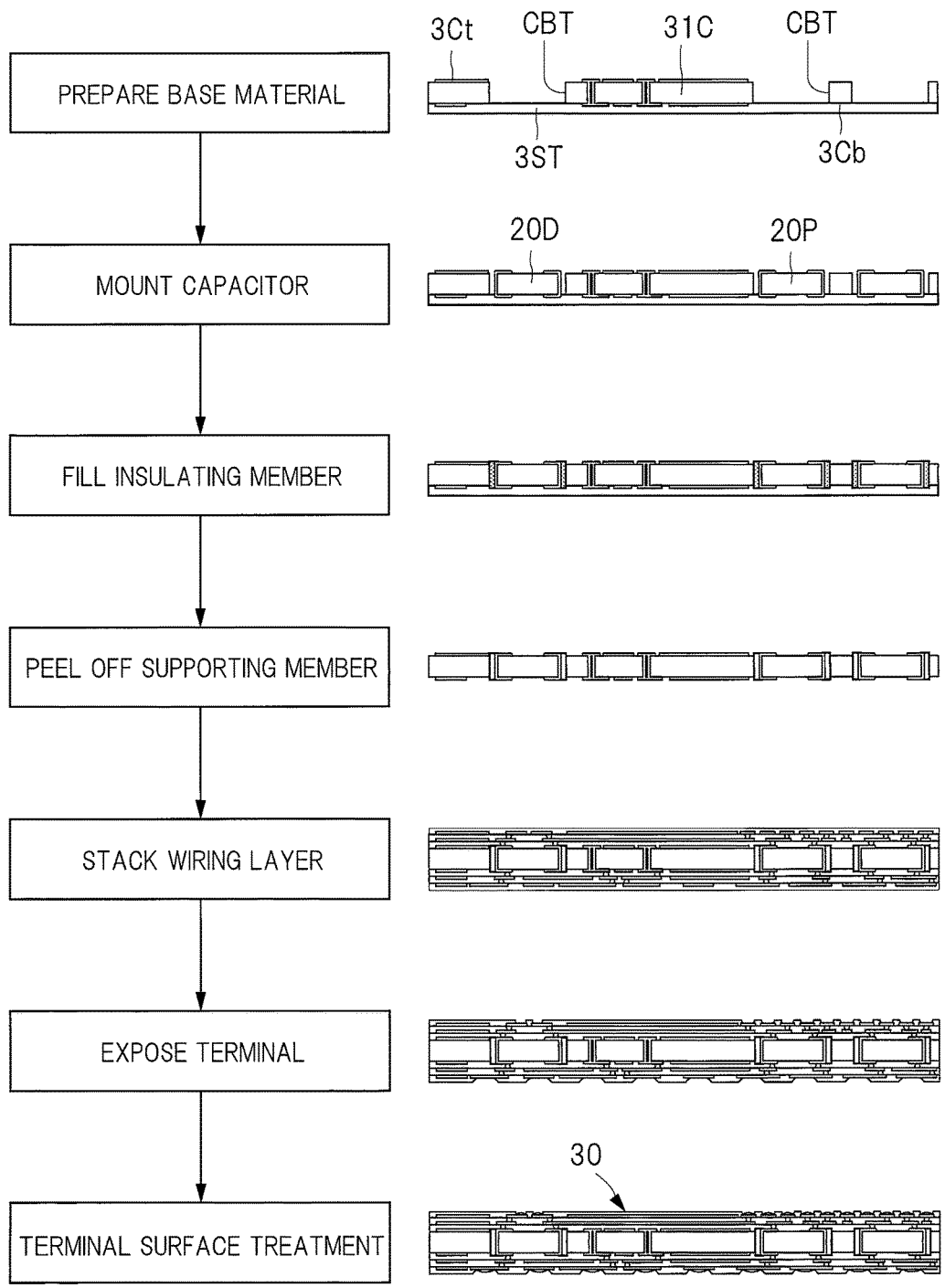
FIG. 26 is an explanatory diagram illustrating an exemplary manufacturing process of a wiring substrate prepared in a wiring substrate preparation process illustrated in FIG. 25.

26 is prepared. FIG. 26 is an explanatory diagram illustrating an exemplary manufacturing process of the wiring substrate prepared in the wiring substrate preparation process illustrated in FIG. 25. The wiring substrate 30 illustrated in FIG. 26 is the wiring substrate 30 in the state before mounting the semiconductor chip 12, the support frame 42, the heat dissipation plate 40, and the plurality of solder balls SB, of the wiring substrate 30 illustrated in FIG. 6.

The wiring substrate 30 illustrated in FIG. 26 is manufactured as follows, for example. First, in a base material preparation process, a base material in a state of having a support tape (supporting member) 3ST as a supporting member attached to the insulating layer 31C serving as the core insulating layer is prepared. In the example illustrated in FIG. 26, the support tape 3ST is attached to the insulating layer 31C. Note that it is sufficient if the support tape 3ST is attached to either one of the upper surface 3Ct and the lower surface 3Cb of the insulating layer 31C. The plurality of through-hole wirings 3TW (see FIG. 6) are formed in the insulating layer 31C. Moreover, a plurality of conductor patterns constituting the wiring layer WL3 illustrated in FIG. 6 are formed over the upper surface 3Ct of the insulating layer 31C, and a plurality of conductor patterns constituting the wiring layer WL4 are formed over the lower surface 3Cb. Also, an opening CBT penetrating from one of the upper surface 3Ct and the lower surface 3Cb to the other is formed in the insulating layer 31C, specifically in a region in which each of the capacitors 20D and 20P is to be mounted.

Next, in a capacitor mounting process, each of the capacitors 20D and 20P is arranged in the opening CBT. In this process, the capacitors 20D and 20P are supported by the support tape 3ST.

Next, in an insulating member filling process, the insulating member 33 (see FIG. 6) is filled around the capacitors 20D and 20P and cured. As a result, each of the capacitors 20D and 20P is fixed in the opening CBT.

Next, in a supporting member peeling process, the support tape 3ST is peeled from the insulating layer 31C to which the capacitors 20D and 20P are fixed.

Next, in a wiring layer stacking process, the wiring layers WL2 and WL1 illustrated in FIG. 6 are sequentially stacked. Moreover, the insulating layer 31T is formed so as to cover the wiring layer WL1. Also, the wiring layers WL5 and WL6 are sequentially stacked on the lower surface 3Cb side of the insulating layer 31C. Moreover, the insulating layer 31B is formed so as to cover the wiring layer WL6. The present process can be performed by the so-called build-up method of sequentially forming an insulating layer, a via wiring, and a wiring layer.

Next, in a terminal exposing process, an opening is formed in the insulating layer 31T illustrated in FIG. 6, and at least a part of each of the plurality of terminals 3BF and 3TP is exposed from the insulating layer 31T. Also, in the terminal exposing process, an opening is formed in the insulating layer 31B illustrated in FIG. 6 to expose at least a part of each of the plurality of lands 3LD from the insulating layer 31B.

Next, in a terminal surface treatment process, surface treatment is applied to each of front surfaces of the plurality of exposed terminals to form a metal film 3mf illustrated in FIG. 10, for example. For example, a solder material can be used as the metal film 3mf. Moreover, the metal film 3mf may be a stacked film of nickel (Ni) and gold (Au) formed by plating, for example, or a stacked film of nickel, palladium (Pd), and gold.

According to the above processes, the wiring substrate 30 incorporating the capacitors 20D and 20P can be obtained. Note that, as described above, in a case where a part of the plurality of capacitors 20D and 20P is mounted on the upper surface 3t of the wiring substrate 30, the capacitor is mounted between the wiring substrate preparation process and the heat dissipation plate mounting process illustrated in FIG. 25.

2. Semiconductor Chip Mounting Process

Next, in a semiconductor chip mounting process illustrated in FIG. 25, the semiconductor chip 12 is mounted over the upper surface 3t of the wiring substrate 30 as illustrated in FIG. 5 and FIG. 6.

In this process, the semiconductor chip 12 is prepared (semiconductor chip preparation process) and mounted over a region of the upper surface 3t of the wiring substrate 30 illustrated in FIG. 6 where the plurality of terminals 3BF are formed. In the example illustrated in FIG. 6, the semiconductor chip 12 is mounted in a state where the front surface 1t (see FIG. 6) of the semiconductor chip 12 and the upper surface 3t of the wiring substrate 30 face each other by the so-called facedown mounting method (also referred to as the flip-chip connecting method).

Also, in this process, as illustrated in FIG. 6, the plurality of pads 1PD formed on the front surface 1t side of the semiconductor chip 12 are electrically connected with the plurality of terminals 3BF of the wiring substrate 30 via the plurality of projecting electrodes 1BP, respectively. In a case where the plurality of terminals 3BF are arranged in rows and columns as in the present embodiment, solder bumps formed by spherically molding a solder material as the plurality of projecting electrodes 1BP are used, in many cases. Note that the projecting electrode 1BP is not limited to the solder bump, and it is applicable to use a pillar bump obtained by molding a metal material such as copper into a column shape.

Also, in this process, the underfill resin (insulating resin) 32 is arranged between the semiconductor chip 12 and the wiring substrate 30. The underfill resin 32 is arranged so as to seal the electrical connection portions (bonding portions of the plurality of projecting electrodes 1BP) between the semiconductor chip 12 and the wiring substrate 30. In this manner, by arranging the underfill resin 32 to seal the connection portions of the plurality of projecting electrodes 1BP, it is possible to relieve the stress generated in the electrical connection portion between the semiconductor chip 12 and the wiring substrate 30.

There are roughly two types of methods of forming the underfill resin 32. In a pre-coating method as a first method, the underfill resin 32 is arranged over a chip mounting region before mounting the semiconductor chip. Next, the semiconductor chip 12 is pressed onto the underfill resin 32 to electrically connect the wiring substrate 30 with the semiconductor chip 12. Thereafter, the underfill resin 32 is cured to obtain a structure illustrated in FIG. 6. Note that, in the present method of arranging the resin material before mounting the semiconductor chip 12, it is also possible to use a film-like resin material other than the paste-like resin material described above. In this case, it is not "coating" work but "attachment" work.

Moreover, in a post injection method as the second method, the semiconductor chip 12 is electrically connected with the wiring substrate 30 before the underfill resin 32 is arranged. Thereafter, a liquid resin is injected into a gap between the semiconductor chip 12 and the wiring substrate 30 to be cured, thereby obtaining the resin body illustrated in FIG. 6. In the present process, either of the pre-coating (or pre-attachment) method and the post injection method described above may be used.

4. Heat Dissipation Plate Mounting Process

Next, in a heat dissipation plate mounting process illustrated in FIG. 25, the heat dissipation plate 40 is mounted over the semiconductor chip 12 to allow the semiconductor chip 12 to be covered with the heat dissipation plate 40 as illustrated in FIG. 6.

In the present process, as illustrated in FIG. 6, the heat dissipation plate 40 is prepared (heat dissipation plate preparation process) and mounted over the upper surface 3t of the wiring substrate 30 so as to cover the semiconductor chip 12. With this process, the semiconductor chip 12 is covered with the heat dissipation plate 40. Meanwhile, the test terminal 3TP connected with each of the plurality of DC cut-off capacitors 20D is not covered with the heat dissipation plate and exposed from the heat dissipation plate 40 as illustrated in FIG. 5 and FIG. 6.

There are various methods of attaching the heat dissipation plate 40. For example, in the example illustrated in FIG. 6, the support frame 42 is attached to a peripheral portion of the heat dissipation plate 40, and the heat dissipation plate 40 is bonded to be fixed to the wiring substrate 30 via the support frame 42. Also, the adhesive member (heat dissipation resin) 41 is applied to the back surface 1b of the semiconductor chip 12, and the heat dissipation plate 40 is bonded to be fixed to the semiconductor chip 12 via the adhesive member 41.

Alternatively, as another method, the support frame 42 may be bonded to be fixed to the wiring substrate 30, and the heat dissipation plate 40 may be mounted on the fixed support frame 42. Moreover, as another modification to FIG. 6, it is applicable to omit the support frame 42 and to bond and fix the heat dissipation plate 40 to the semiconductor chip 12.

Note that, as a modification to the present embodiment, the present process can be omitted in a case where the heat dissipation plate 40 is not attached.

5. Ball Mounting Process

Next, in a ball mounting process illustrated in FIG. 25, the plurality of solder balls SB are attached to the lower surface 3b side as the mounting surface of the wiring substrate 30 as illustrated in FIG. 4 and FIG. 6. In this process, the solder balls SB are arranged on the lands 3LD exposed from the insulating layer 31B illustrated in FIG. 4 and FIG. 6, and reflow treatment (treatment of heating a soldering component to be melt-bonded and then cooled) is performed to have the solder balls SB bonded to the lands 3LD. Note that, in a case where this solder ball SB is not used as a conductive material for electrically connecting the wiring board MB1 and the semiconductor device PKG2 illustrated in FIG. 1, this process can be omitted. Alternatively, in this process, it is applicable to form a metal film such as a thin solder film instead of the solder ball SB, on the exposed surface of the land 3LD.

6. Electrical Test Process (DC Test Process)

Figure 27:
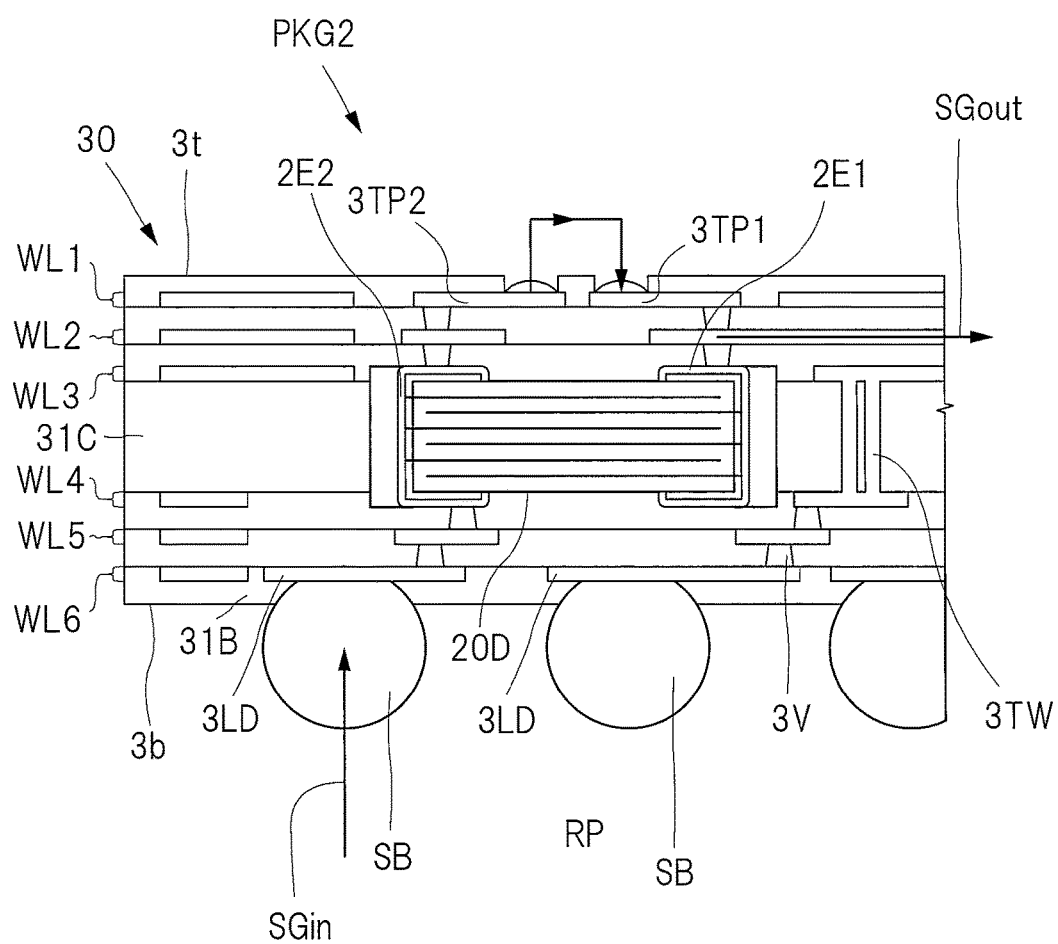
FIG. 27 is an enlarged cross-sectional view schematically illustrating a state of performing inspection by short-circuiting an electrode of a DC cut-off capacitor in an electrical test process illustrated in FIG. 25.

Next, in an electrical test process illustrated in FIG. 25, the circuit formed in the semiconductor device PKG2 is subjected to the electrical test. This electrical test includes a DC test in which a DC current is applied for inspection. The DC test includes, for example, a continuity test for checking an electrical connection state of the circuit. FIG. 27 is an enlarged cross-sectional view schematically illustrating a state of performing inspection by short-circuiting an electrode of a DC cut-off capacitor in the electrical test process illustrated in FIG. 25.

In the DC test, as described above, since the inspection is performed by applying a DC current, the current for inspection would be cut off when the circuit to be inspected includes the DC cut-off capacitor 20D. Therefore, when performing the DC test of the high speed transmission path with the capacitor 20D inserted, there is a need to input a DC inspection signal SGin in a state where the electrode 2E2 and the electrode 2E1 of the capacitor 20D are short-circuited as schematically illustrated in FIG. 27. When the electrode 2E2 and the electrode 2E1 of the capacitor 20D are short-circuited, an inspection signal SGout is output from the electrode 2E1 side, and the DC test of the entire circuit can be performed, even when the DC cut-off capacitor 20D is inserted in series connection into the high speed transmission path.

Here, as illustrated in FIG. 27, in order to short-circuit the electrode 2E2 and the electrode 2E1 of the capacitor 20D, there is a need to have a structure capable of easily bringing a conductive member into contact with both the electrode 2E1 and the electrode 2E2 of the capacitor 20D. Therefore, in the present embodiment, the electrodes 2E1 and 2E2 of the DC cut-off capacitor 20D are electrically connected with the test terminals 3TP1 and 3TP2 exposed from the wiring substrate 30, respectively. In this case, even when the electrode 2E1 and the electrode 2E2 of the capacitor 20D are arranged inside the wiring substrate 30, it is possible to short-circuit the electrode 2E2 and the electrode 2E1 of the capacitor 20D via the test terminals 3TP1 and 3TP2.

There are various modes for the conductive member for short-circuiting the electrode 2E2 and the electrode 2E1 of the capacitor 20D. For example, the inspection signal SGin is input from the solder ball SB (see FIG. 6) side on the mounting surface side in a state where a needle-shaped conductive member (contactor) electrically connected via a wiring is brought into contact with each of the terminal 3TP1 and the terminal 3TP2. In this case, the inspection signal SGout having passed through the test terminals 3TP2 and 3TP1 is output from the electrode 2E1 side.

<Method of Mounting Semiconductor Device>

Next, a method of mounting the semiconductor device PKG1 and the semiconductor device PKG2 on the wiring board MB1 as a motherboard to electrically connect the semiconductor device PKG1 with the semiconductor device PKG2 will be described with reference to FIG. 1.

As illustrated in FIG. 1, a plurality of terminals TM1 for connecting the semiconductor device PKG1 and a plurality of terminals TM2 for connecting the semiconductor device PKG2 are formed on an upper surface (mounting surface) MBt of the wiring board MB1. The semiconductor device PKG1 includes a plurality of solder balls SB serving as external terminals. In the semiconductor device mounting method according to the present embodiment, the plurality of solder balls SB of the semiconductor device PKG1 are bonded to the plurality of terminals TM1 of the wiring board MB1, respectively, to electrically connect the semiconductor device PKG1 with the wiring board MB1. Moreover, in the semiconductor device mounting method according to the present embodiment, the plurality of solder balls SB of the semiconductor device PKG2 are bonded to the plurality of terminals TM2 of the wiring board MB1, respectively, to electrically connect the semiconductor device PKG2 with the wiring board MB1.

As described above, the semiconductor device PKG1 and the semiconductor device PKG2 are electrically connected to the wiring board MB1, whereby the semiconductor device PKG1 and the semiconductor device PKG2 are electrically connected with each other through the high speed transmission path SGP2 of the wiring board MB1. At this time, in the present embodiment, since the DC cut-off capacitor 20D is mounted in the semiconductor device PKG2, the capacitor 20D is not mounted on the wiring board MB1. This makes it possible to reduce a size of the wiring board MB1, achieving miniaturization of the electronic device EDV1. In addition, there is no need to mount the DC cut-off capacitor 20D on the wiring board MB1 serving as the motherboard, so that a component mounting area on the wiring board MB1 can be reduced, leading to enhancement of a degree of freedom in wiring design of the wiring board MB1. As a result, signal quality and power supply quality can be enhanced.

Modification

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in FIG. 5, a description has been given regarding an implementation mode in which each of the plurality of capacitors 20P for the power supply circuit is arranged at a position overlapping with the semiconductor chip 12 and each of the plurality of DC cut-off capacitors 20D is arranged at a position not overlapping with the semiconductor chip 12. Other than this, there are various modifications in the positional relation between the semiconductor chip 12 and the capacitor 20D or 20P in plan view.

Figure 28:
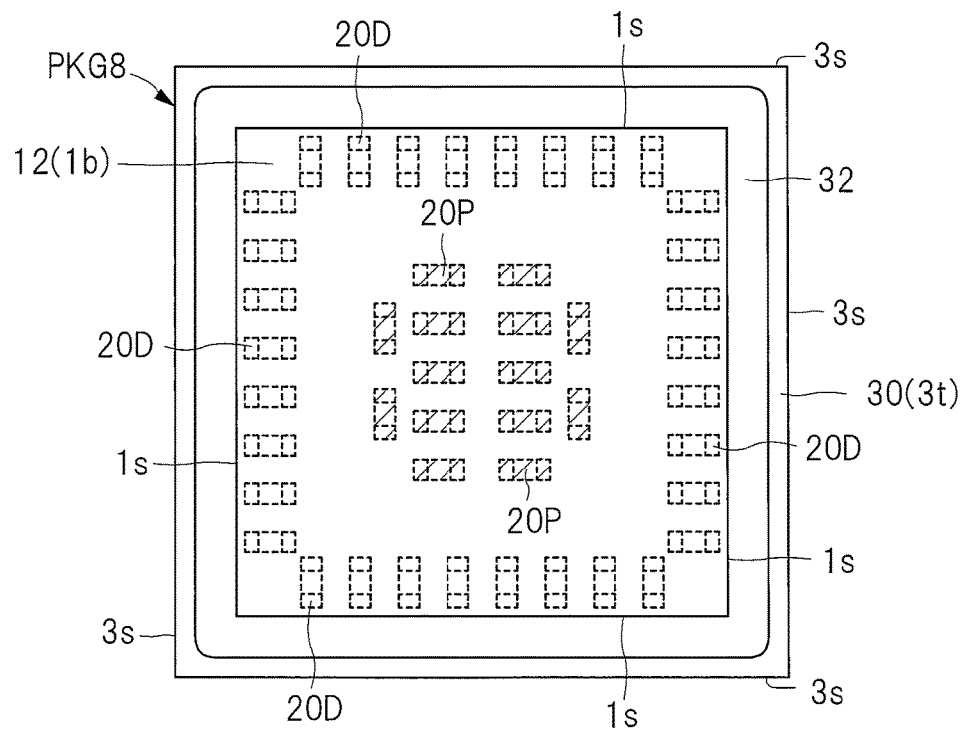
FIG. 28 is a plan view illustrating an upper surface side of a semiconductor device according to a modification to FIG. 1.
Figure 29:
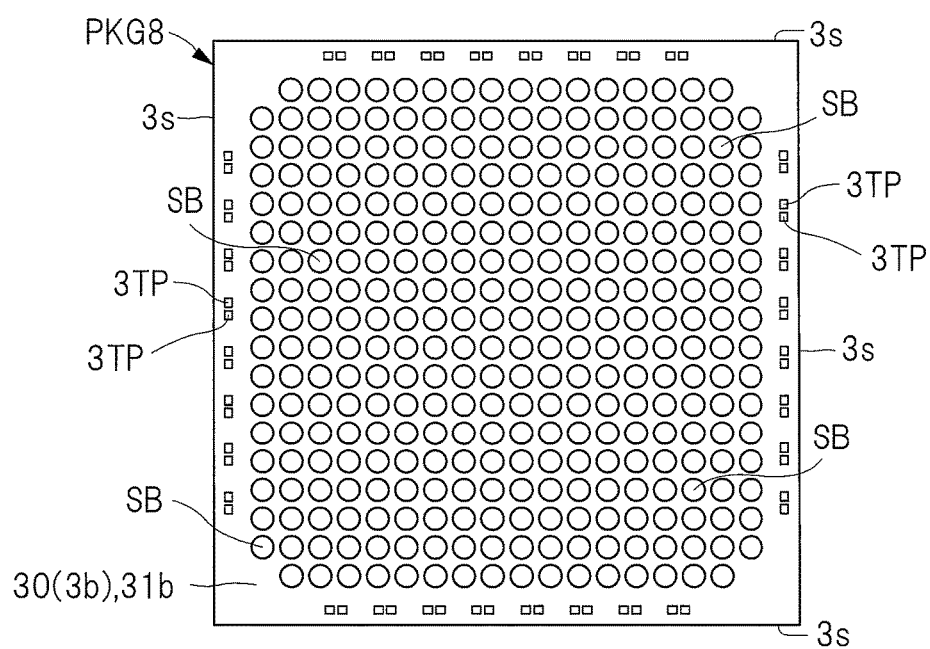
FIG. 29 is a bottom view of the semiconductor device illustrated in FIG. 28.

For example, the plurality of capacitors 20D and the semiconductor chip 12 may overlap with each other in plan view in a case where the plurality of capacitors 20D are incorporated as in a semiconductor device PKG8 illustrated in FIG. 28. FIG. 28 is a plan view illustrating an upper surface side of a semiconductor device according to a modification to FIG. 1. Also, FIG. 29 is a bottom view of the semiconductor device illustrated in FIG. 28. Note that, in FIG. 28, in order to clearly illustrate a planar positional relation between the plurality of capacitors and the semiconductor chip, outlines of the plurality of capacitors incorporated in the wiring substrate 30 are indicated by dotted lines. In addition, although FIG. 5 is a plan view, in order to easily distinguish between the capacitor 20D and the capacitor 20P among the plurality of capacitors, each of the plurality of capacitors 20P is hatched.

The semiconductor device PKG8 illustrated in FIG. 28 is different from the semiconductor device PKG2 illustrated in FIG. 5 in that each of the plurality of capacitors 20D and the plurality of capacitors 20P overlaps with the semiconductor chip 12 in plan view. In a case where the capacitor 20D is incorporated in the wiring substrate 30, the semiconductor chip 12 can be mounted above the capacitor 20D. Therefore, even when an area of the back surface 1b of the semiconductor chip 12 is large, it is possible to mount the capacitor 20D in the same package as the semiconductor chip 12 and to suppress an increase in planar size of the package.

Moreover, as illustrated in FIG. 28, as a planar area of the semiconductor chip 12 increases, a separation distance between the side surface is of the semiconductor chip 12 and the side surface 3s of the wiring substrate 30 decreases. Therefore, in a case where the test terminal 3TP (see FIG. 29) is formed on the upper surface 3t side of the wiring substrate 30, the terminal 3TP might be covered with the underfill resin 32 depending on the extent of the spreading range of the underfill resin 32.

Therefore, in the case of the semiconductor device PKG8, it is preferable to expose the plurality of test terminals 3TP in the lower surface 3b of the wiring substrate 30 similarly to the semiconductor device PKG5 described with reference to FIG. 13 and FIG. 14.

Moreover, the semiconductor device PKG8 illustrated in FIG. 28 is different from the semiconductor device PKG1 illustrated in FIG. 1 in that the heat dissipation plate 40 illustrated in FIG. 1 is not mounted over the back surface 1b of the semiconductor chip 12. Installation of the heat dissipation plate 40 illustrated in FIG. 1 and FIG. 6 is determined in accordance with thermal specification of the semiconductor device. For this reason, besides the example illustrated in FIG. 28, for example, there may be a semiconductor device illustrated in FIG. 6 without having the heat dissipation plate 40 and the support frame 42 mounted therein. Alternatively, the heat dissipation plate 40 (see FIG. 6) may be attached to the semiconductor device PKG8 illustrated in FIG. 28.

Furthermore, even in the case of attaching the heat dissipation plate 40, there are various modifications in the shape of the heat dissipation plate 40. For example, instead of providing the support frame 42 illustrated in FIG. 6, the heat dissipation plate 40 may simply be attached to the back surface 1b of the semiconductor chip 12 via the adhesive (heat dissipation resin) 41. Moreover, a single plate may be molded so as to serve both the function of the support frame 42 and the function of the heat dissipation plate 40 illustrated in FIG. 6.

Figure 30:
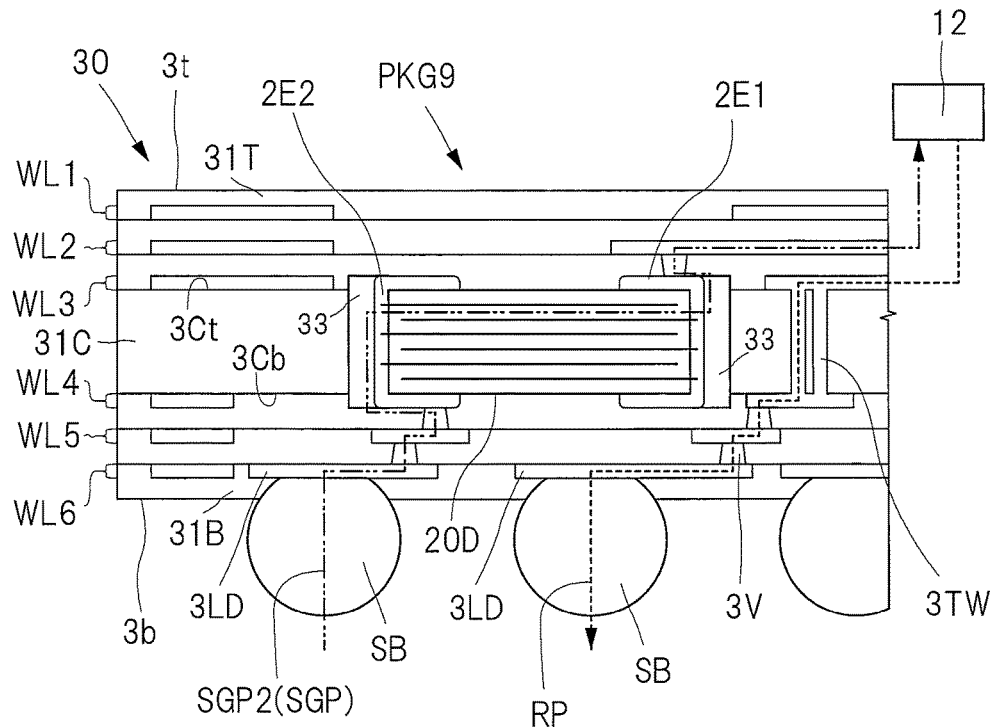
FIG. 30 is an enlarged cross-sectional view schematically illustrating an exemplary signal transmission path connected to a DC cut-off capacitor provided in a semiconductor device according to a modification to FIG. 10.

In addition, in FIG. 10 to FIG. 17, an implementation mode in which a test wiring path is connected to the capacitor 20D has been described. However, in the case of a product not requiring a DC test for the signal transmission path into which the capacitor 20D is inserted, there is no need to connect the test wiring path to the capacitor 20D as in a semiconductor device PKG9 illustrated in FIG. 30. FIG. 30 is an enlarged cross-sectional view schematically illustrating an exemplary signal transmission path connected to a DC cut-off capacitor provided in a semiconductor device according to a modification to FIG. 10.

In the case of the semiconductor device PKG9, since the test wiring path is not connected to the signal transmission path through the capacitor 20D, influence of noise on the signal transmission path can be reduced as compared with the semiconductor device PKG2 illustrated in FIG. 10. However, in the case of the semiconductor device PKG9, it is difficult to perform a DC test on the signal transmission path that passes through the capacitor 20D.

Figure 31:
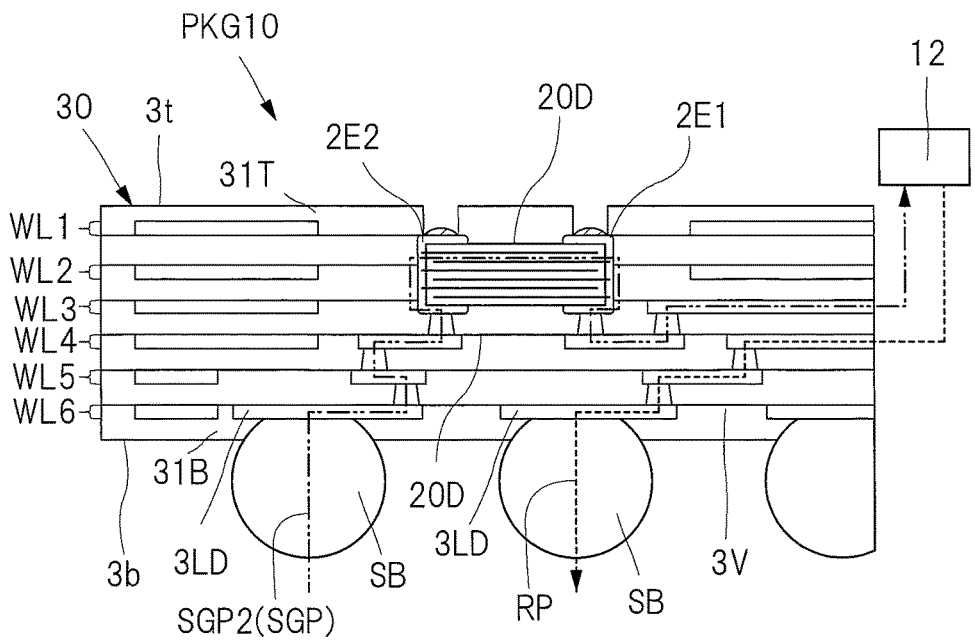
FIG. 31 is an enlarged cross-sectional view schematically illustrating an exemplary signal transmission path connected to a DC cut-off capacitor provided in a semiconductor device according to another modification to FIG. 10.

Also, in the example illustrated in FIG. 6, the wiring substrate 30 is a wiring substrate in which a plurality of wiring layers are stacked on each of the upper surface 3Ct side and the lower surface 3Cb side of the insulating layer 31C serving as the core material. Alternatively, as a modification to FIG. 6, it is applicable to use, as a semiconductor device PKG10 illustrated in FIG. 31, a so-called coreless substrate formed by sequentially stacking conductor patterns such as the insulating layer 31 and the wiring 3W without including the insulating layer 31C (see FIG. 6) made of a hard material such as a prepreg material. FIG. 31 is an enlarged cross-sectional view schematically illustrating an exemplary signal transmission path connected to the DC cut-off capacitor provided in the semiconductor device according to another modification to FIG. 10.

The semiconductor device PKG10 illustrated in FIG. 31 is different from the semiconductor device PKG2 illustrated in FIG. 6 in that it does not include the insulating layer 31C illustrated in FIG. 6. Moreover, the semiconductor device PKG10 is different from the semiconductor device PKG2 illustrated in FIG. 10 in that a portion of each of the electrode 2E1 and the electrode 2E2 included in the capacitor 20D is exposed from the wiring substrate 30.

In the case of using a coreless substrate like the semiconductor device PKG10, the through-hole wiring 3TW illustrated in FIG. 6 is not formed. Therefore, even in a case where the capacitor 20D is arranged in an arbitrary wiring layer of the wiring substrate 30, the problem of the impedance discontinuity point due to the through-hole wiring 3TW (see FIG. 6) would not occur.

For example, in the example of the semiconductor device PKG10, the capacitor 20D is arranged across the wiring layers WL1 and WL2 and the wiring layer WL3. Also, a portion of each of the electrode 2E1 and the electrode 2E2 of the capacitor 20D is exposed from the uppermost insulating layer 31T in the upper surface 3t of the wiring substrate 30. Therefore, in the example of the semiconductor device PKG10, the exposed portions of the electrode 2E1 and the electrode 2E2 can be used as the test terminal 3TP illustrated in FIG. 10.

Note that, according to the definition of the state of being "incorporated in the wiring substrate 30" in the present application described above, the capacitor 20D illustrated in FIG. 31 is handled as a state of being incorporated in the wiring substrate 30. Also, although not illustrated in the figure, a portion of each of the electrode 2E1 and the electrode 2E2 included in the capacitor 20D may be exposed from the lowermost insulating layer 31B in the lower surface 3b of the wiring substrate 30. Furthermore, FIG. 31 illustrates, as a representative example, an example in which a portion of the capacitor 20D is exposed from the wiring substrate 30. Alternatively, a portion of the capacitor 20P illustrated in FIG. 6 may be exposed from the wiring substrate 30.

In addition, it is possible to apply the modifications in combination within the scope of the technical idea that has been described in the above-described embodiment.

A part of the description of the above embodiment will be described below.

[Supplementary Note 1]

A method of manufacturing a semiconductor device, including the steps of:

(a) preparing a wiring substrate including a first surface and a second surface opposite to the first surface; and (b) mounting a semiconductor chip including a plurality of chip electrodes on the first surface side of the wiring substrate, in which the wiring substrate includes:

a first capacitor incorporated in the wiring substrate; and a second capacitor arranged between the first capacitor and a peripheral portion of the wiring substrate in plan view, the second capacitor is inserted in series connection into a signal transmission path through which an electric signal is input to or output from the semiconductor chip, and in the step (b), in plan view, the semiconductor chip is mounted at a position overlapping with the first capacitor.

EXPLANATION OF REFERENCE CHARACTERS

1b Back surface (main surface, lower surface)
1BP Projecting electrode (bump electrode)
1PD Pad (electrode pad, bonding pads)
1s Side surface
1t Front surface (main surface, upper surface)
2BD Main body
2E, 2E1, 2E2, 2E3, 2E4 Electrode
2Eb Lower surface
2Et Upper surface
2LS Long side (long side surface)
2SS Short side (short side surface)
3b Lower surface (surface, main surface, mounting surface)
3BF Terminal (bonding pad, bonding lead, chip connection terminal)
3Cb Lower surface
3Ct Upper surface
3K1, 3K2, 3K3 Opening
3LD, 3LH, 3LL, 3LVd, 3LVs Land (external terminal, terminal)
3mf Metal film
3PL Conductor plane (pattern)
3s Side surface
3ST Support tape (supporting member)
3t Upper surface (surface, main surface, chip mounting surface)
3TP, 3TP1, 3TP2 Terminal (terminal for test, test terminal)
3TW Through-hole wiring
3V, 3V12, 3V23, 3V23, 3V45, 3V56, 3VL, 3VS Via wiring
3W Wiring
11, 12 Semiconductor chip
20CL Conductor plate
20D, 20P Capacitor (chip capacitor, ceramic capacitor)
20IL Insulating layer (dielectric layer)
30 Wiring substrate
31 Insulating layer
31B, 31T Insulating layer (solder resist film)
31C Insulating layer (core material, core insulating layer)
32 Underfill resin (insulating resin)
33 Insulating member (filler material)
40 Heat dissipation plate (heat spreader, member)
41 Adhesive member (heat dissipation resin)
42 Support frame (stiffener ring)
CBT Opening
DL Extending direction (longitudinal direction)
DSp, DSn Differential signal transmission path
DW Width direction
EDV1 Electronic device (electronic equipment)
MB1 Wiring board (motherboard, mounting board)
MBt Upper surface (mounting surface)
PKG2, PKG3, PKG4, PKG5, PKG6, PKG7, PKG8, PKG9, PKG10, PKGh1 Semiconductor device
RP Return path
Rx, RxL, Rxn, Rxp Electrode (electrode pad)
SB Solder ball (solder material, external terminal, electrode, external electrode)
SD Bonding member
SGin, SGout Inspection signal
SGP Signal transmission path
SGP1 Low speed transmission path
SGP2 High speed transmission path
TM1, TM2 Terminal
Tx, TxL, Txn, Txp Electrode (electrode pad)
Vd, Vs electrode (electrode pad)
VDD Power supply potential
VDP Power supply potential supply path
VSP Reference potential supply path
VSS Reference potential
WL1, WL2, WL3, WL4, WL5, WL6 Wiring layer

The invention claimed is:

1. A semiconductor device comprising:
a wiring substrate including a first surface and a second surface opposite to the first surface;
a semiconductor chip including a plurality of chip electrodes and mounted over the wiring substrate;
a first capacitor arranged at a position overlapping with the semiconductor chip in plan view and embedded in the wiring substrate; and
a second capacitor arranged between the first capacitor and a peripheral portion of the wiring substrate in plan view,
wherein the second capacitor is inserted in series connection into a signal transmission path through which an electric signal is input to or output from the semiconductor chip,
wherein the second capacitor is embedded in the wiring substrate and is not exposed from the wiring substrate,
wherein, in plan view, the second capacitor is arranged at a position not overlapping with the semiconductor chip,
wherein the wiring substrate includes:
a plurality of chip connection terminals arranged on the first surface side and electrically connected with the plurality of chip electrodes of the semiconductor chip, respectively;
a plurality of external terminals arranged on the second surface side; and
a first terminal and a second terminal electrically connected with the second capacitor,
wherein the second capacitor includes:
a first electrode electrically connected with each of a first chip connection terminal among the plurality of chip connection terminals and the first terminal; and
a second electrode electrically connected with each of a first external terminal among the plurality of external terminals and the second terminal,
wherein a portion of the first terminal is exposed from the first surface of the wiring substrate or from the second surface of the wiring substrate, and
wherein a portion of the second terminal is exposed from the first surface of the wiring substrate or from the second surface of the wiring substrate.

2. The semiconductor device according to claim 1,
wherein the first capacitor is connected to a power supply potential supply path through which a power supply potential is supplied to the semiconductor chip.

3. The semiconductor device according to claim 2,
wherein, in plan view, an interval between the second capacitor and a peripheral edge of the wiring substrate is smaller than an interval between the second capacitor and the semiconductor chip.

4. The semiconductor device according to claim 2,
wherein the wiring substrate includes:
a first insulating layer having a third surface located between the first surface and the second surface and having a fourth surface opposite to the third surface; and
a plurality of through-hole wirings formed so as to penetrate from one of the third surface and the fourth surface of the first insulating layer to the other of the third surface and the fourth surface, and
wherein the second capacitor is arranged between the third surface and the fourth surface and is electrically isolated from the plurality of through-hole wirings.

5. The semiconductor device according to claim 4,
wherein, in a cross-sectional view, a thickness of the second capacitor is less than or equal to a thickness of the first insulating layer.

6. The semiconductor device according to claim 2,
wherein a first opening is formed in a first insulating layer of the wiring substrate,
wherein a second opening is formed in the first insulating layer of the wiring substrate in a vicinity of the first opening,
wherein a portion of the first terminal is exposed at a bottom of the first opening,
wherein a portion of the second terminal is exposed at a bottom of the second opening, and
wherein the first and second openings overlap with the second capacitor in plan view.

7. The semiconductor device according to claim 6,
wherein each of a wiring path distance from the first electrode of the second capacitor to the first terminal of the wiring substrate and a wiring path distance from the second electrode of the second capacitor to the second terminal of the wiring substrate is equal to or smaller than one-quarter of a wavelength of the electric signal.

8. The semiconductor device according to claim 6,
wherein, in plan view, the first terminal and the second terminal are arranged at positions overlapping with the second capacitor.

9. The semiconductor device according to claim 6,
wherein the first terminal and the second terminal are formed on the first surface side of the wiring substrate,
wherein a first member covering the entire semiconductor chip is mounted over the first surface of the wiring substrate, and
wherein, in plan view, the first terminal and the second terminal are arranged between the first member and a peripheral edge of the wiring substrate.

10. The semiconductor device according to claim 6,
wherein a first member covering the entire semiconductor chip is mounted over the first surface of the wiring substrate,
wherein, in plan view, the second capacitor is arranged at a position overlapping with the first member, and
wherein the first terminal and the second terminal are formed on the second surface side of the wiring substrate.

11. The semiconductor device according to claim 1,
wherein the portions of the first and second terminals are exposed such that, during electrical testing of the second capacitor, a short circuit external to the wiring substrate can be applied to the first and second electrodes of the second capacitor via the first and second terminals.

12. A semiconductor device comprising:
a wiring substrate including a first surface and a second surface opposite to the first surface;
a semiconductor chip including a plurality of chip electrodes and mounted over the wiring substrate; and
a capacitor arranged at a position not overlapping with the semiconductor chip in plan view and embedded in the wiring substrate,
wherein the capacitor is inserted in series connection into a signal transmission path through which an electric signal is input to or output from a first circuit formed in the semiconductor chip,
wherein the capacitor is not exposed from the wiring substrate,
wherein, in plan view, the capacitor is arranged at a position not overlapping with the semiconductor chip, wherein the wiring substrate includes:
- a plurality of chip connection terminals arranged on the first surface side and electrically connected with the plurality of chip electrodes of the semiconductor chip, respectively;
- a plurality of external terminals arranged on the second surface side; and
- a first terminal and a second terminal electrically connected with the capacitor, wherein the capacitor includes:
- a first electrode electrically connected with each of a first chip connection terminal among the plurality of chip connection terminals and the first terminal; and
- a second electrode electrically connected with each of a first external terminal among the plurality of external terminals and the second terminal, wherein a portion of the first terminal is exposed from the first surface of the wiring substrate or from the second surface of the wiring substrate, and wherein a portion of the second terminal is exposed from the first surface of the wiring substrate or from the second surface of the wiring substrate.

13. The semiconductor device according to claim 12, wherein the wiring substrate includes:
- a first insulating layer having a third surface located between the first surface and the second surface and having a fourth surface opposite to the third surface; and
- a plurality of through-hole wirings formed so as to penetrate from one of the third surface and the fourth surface of the first insulating layer to the other of the third surface and the fourth surface, and wherein the capacitor is arranged between the third surface and the fourth surface and is electrically isolated from the plurality of through-hole wirings.

14. The semiconductor device according to claim 13, wherein, in a cross-sectional view, a thickness of the capacitor is less than or equal to a thickness of the first insulating layer.

15. The semiconductor device according to claim 12,
wherein a first opening is formed in a first insulating layer of the wiring substrate,
wherein a second opening is formed in the first insulating layer of the wiring substrate in a vicinity of the first opening,
wherein the portion of the first terminal is exposed at a bottom of the first opening,
wherein the portion of the second terminal is exposed at a bottom of the second opening, and
wherein the first and second openings overlap with the capacitor in plan view.

16. The semiconductor device according to claim 12, wherein the portions of the first and second terminals are exposed such that, during electrical testing of the capacitor, a short circuit external to the wiring substrate can be applied to the first and second electrodes of the capacitor via the first and second terminals.

* * * * *